(12) United States Patent
Ramer et al.

(10) Patent No.: US 8,322,884 B2
(45) Date of Patent: Dec. 4, 2012

(54) SOLID STATE LIGHTING WITH SELECTIVE MATCHING OF INDEX OF REFRACTION

(75) Inventors: David P. Ramer, Reston, VA (US); Jack C. Rains, Jr., Herndon, VA (US)

(73) Assignee: ABL IP Holding LLC, Conyers, GA (US)

( * ) Notice: Subject to any disclaimer, the term of this patent is extended or adjusted under 35 U.S.C. 154(b) by 240 days.

(21) Appl. No.: 12/751,169

(22) Filed: Mar. 31, 2010

(65) Prior Publication Data

US 2011/0242806 A1    Oct. 6, 2011

(51) Int. Cl.
  F21V 13/00 (2006.01)
  F21V 21/00 (2006.01)
  F21S 4/00 (2006.01)
(52) U.S. Cl. ............. 362/249.04; 362/242; 362/249.02
(58) Field of Classification Search .......... 362/26, 362/27, 608, 610, 612, 235, 242, 249.02, 362/311.02, 147
  See application file for complete search history.

(56) References Cited

U.S. PATENT DOCUMENTS

| | | | |
|---|---|---|---|
| 4,635,167 A * | 1/1987 | Schlosser | 362/85 |
| 5,631,992 A | 5/1997 | Takahashi et al. | |
| 5,883,684 A * | 3/1999 | Millikan et al. | 349/65 |
| 6,163,038 A | 12/2000 | Chen et al. | |
| 6,361,192 B1 | 3/2002 | Fussell et al. | |
| 6,483,196 B1 | 11/2002 | Wojnarowski et al. | |
| 6,826,336 B2 | 11/2004 | Guy | |
| 6,871,983 B2 | 3/2005 | Jacob et al. | |
| 6,882,101 B2 * | 4/2005 | Ragle | 313/501 |
| 6,960,872 B2 | 11/2005 | Beeson et al. | |
| 6,969,843 B1 | 11/2005 | Beach et al. | |
| 6,995,355 B2 | 2/2006 | Rains, Jr. et al. | |
| 7,025,464 B2 | 4/2006 | Beeson et al. | |
| 7,026,756 B2 | 4/2006 | Shimizu et al. | |

(Continued)

FOREIGN PATENT DOCUMENTS

WO    WO 2009011360 A1 *    1/2009

OTHER PUBLICATIONS

Entire prosecution history of Hanley et al. U.S. Appl. No. 12/434,248, filed May 1, 2009, Heat Sinking and Flexible Circuit Board, for Solid State Light Fixture Utilizing an Optical Cavity.

(Continued)

*Primary Examiner* — David Crowe
(74) *Attorney, Agent, or Firm* — McDermott Will & Emery LLP

(57) ABSTRACT

Where a lighting device uses solid state emitters and an optic processes light from the emitters, it may improve efficiency in light extraction from the emitters to have an index of refraction matching material in between emitter output and a surface of solid of the optic that receives emitted light. However, such improved out-coupling or extraction efficiency may cause an overall color shift in the output of the overall lighting device, for example, if improved emitter output reduces internal reflection and associated internal phosphor excitation. To reduce the color shift in the output of the lighting device, the device may have index matching material used in association with one or some of the solid state light emitters but not all of the emitters, so that the combined light output of the device exhibits a desired spectral characteristics, e.g. remains a desirable color of white light.

13 Claims, 19 Drawing Sheets

U.S. PATENT DOCUMENTS

| | | | |
|---|---|---|---|
| 7,040,774 B2 | 5/2006 | Beeson et al. | |
| 7,144,131 B2 | 12/2006 | Rains | |
| 7,145,125 B2 | 12/2006 | May et al. | |
| 7,148,632 B2 | 12/2006 | Berman et al. | |
| 7,150,553 B2 * | 12/2006 | English et al. | 362/545 |
| 7,332,746 B1 * | 2/2008 | Takahashi et al. | 257/98 |
| 7,393,705 B1 | 7/2008 | Urbanek | |
| 7,498,734 B2 | 3/2009 | Suehiro et al. | |
| 7,513,669 B2 * | 4/2009 | Chua et al. | 362/606 |
| 7,514,722 B2 | 4/2009 | Kawaguchi et al. | |
| 7,559,664 B1 * | 7/2009 | Walleman et al. | 362/84 |
| 7,618,556 B2 | 11/2009 | Shunichi et al. | |
| 7,768,192 B2 | 8/2010 | Van De Ven et al. | |
| 7,791,092 B2 * | 9/2010 | Tarsa et al. | 257/98 |
| 7,806,540 B2 * | 10/2010 | Yoneda | 362/27 |
| 7,806,581 B2 * | 10/2010 | Lee | 362/612 |
| 7,841,738 B2 * | 11/2010 | Engel | 362/235 |
| 2005/0001537 A1 | 1/2005 | West et al. | |
| 2005/0247944 A1 * | 11/2005 | Haque et al. | 257/79 |
| 2007/0045524 A1 | 3/2007 | Rains, Jr. et al. | |
| 2007/0051883 A1 | 3/2007 | Rains, Jr. et al. | |
| 2007/0081360 A1 * | 4/2007 | Bailey et al. | 362/621 |
| 2007/0138978 A1 | 6/2007 | Rains, Jr. et al. | |
| 2008/0094835 A1 | 4/2008 | Marra et al. | |
| 2008/0277680 A1 | 11/2008 | Bertram et al. | |
| 2009/0295266 A1 | 12/2009 | Ramer et al. | |
| 2009/0296368 A1 | 12/2009 | Ramer | |
| 2009/0303744 A1 * | 12/2009 | Iwasaki | 362/612 |
| 2010/0079983 A1 * | 4/2010 | Kumamoto | 362/147 |

OTHER PUBLICATIONS

Entire prosecution history of Phipps et al. U.S. Appl. No. 12/609,523, filed Oct. 30, 2009, Heat Sinking and Flexible Circuit Board, for Solid State Light Fixture Utilizing an Optical Cavity.

"Light-emitting diode—Wikipedia, the free encyclopedia", downloaded Dec. 7, 2009 from http://en.wikipedia.org/wiki/LED.

U.S. Appl. No. 12/609,523, filed Oct. 30, 2009.

U.S. Appl. No. 12/434,248, filed May 1, 2009.

* cited by examiner

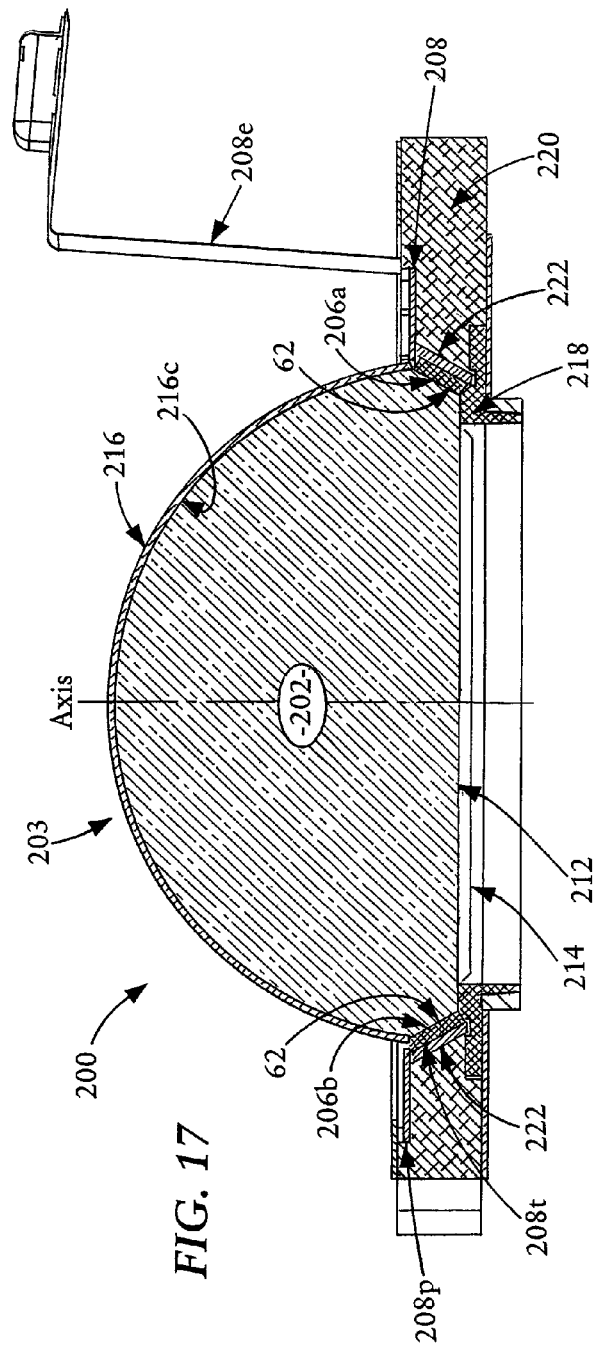
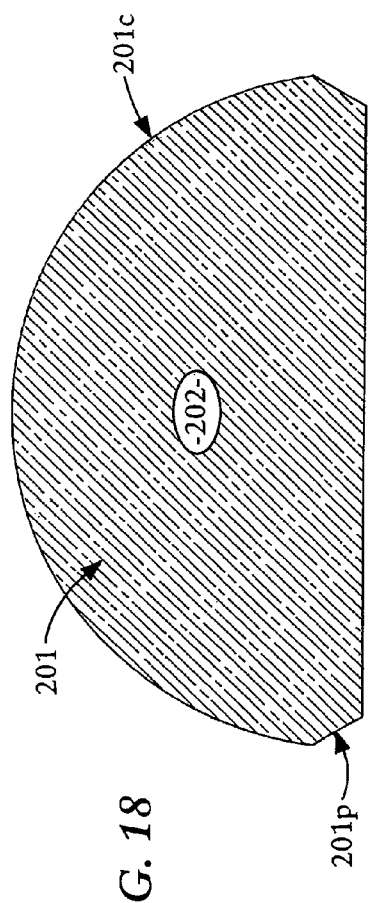
FIG. 17
FIG. 18

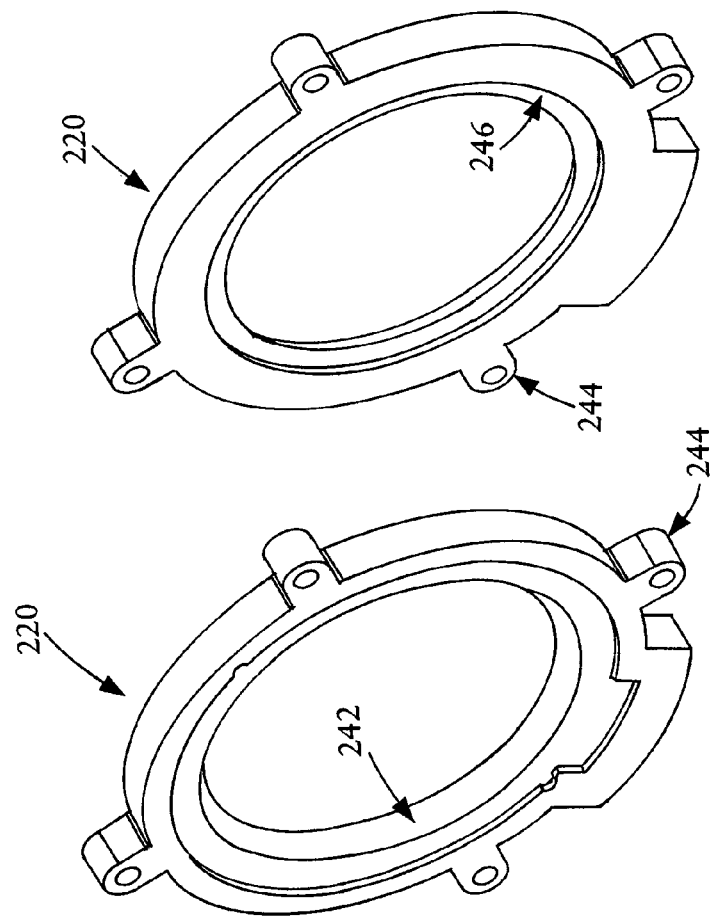
FIG. 34
FIG. 33
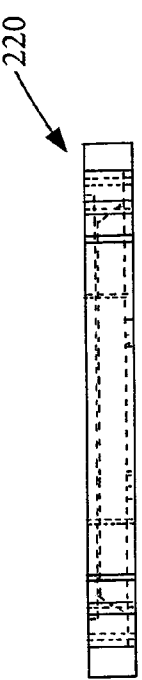
FIG. 32
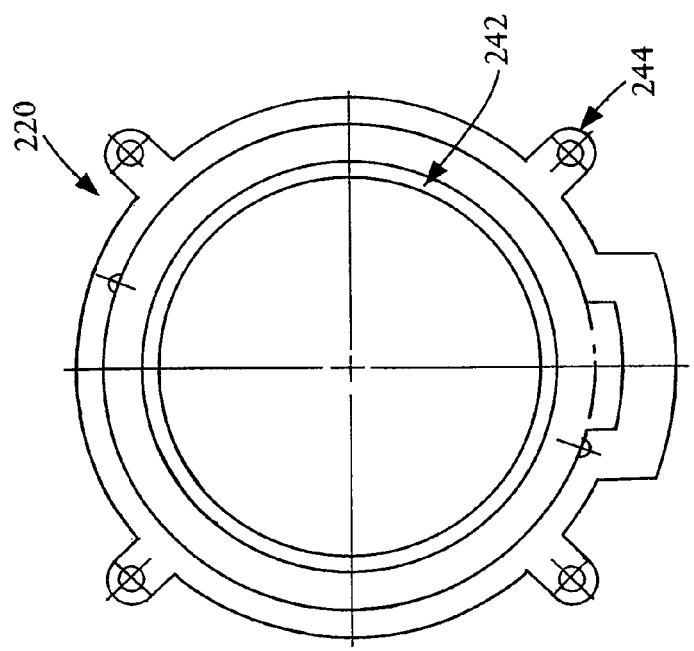
FIG. 31

US 8,322,884 B2

SOLID STATE LIGHTING WITH SELECTIVE MATCHING OF INDEX OF REFRACTION

TECHNICAL FIELD

The present subject matter relates to relates to an arrangement of solid state type light emitters with selective index matching to a material of a cover plate or optic, and to light emitting devices and/or light fixtures for general lighting applications that may use such emitters and index matching.

BACKGROUND

In recent years, as costs of energy increase along with concerns about global warming due to consumption of fossil fuels to generate energy, there is an ever increasing need for more efficient lighting technologies. These demands, coupled with rapid improvements in semiconductors and related manufacturing technologies, are driving a trend in the lighting industry toward the use of light emitting diodes (LEDs) or other solid state light sources to produce light for lighting applications, as replacements for incandescent lighting and eventually as replacements for other older less efficient light sources. In addition, LEDs are non-toxic, unlike compact fluorescent bulbs, which contain trace amounts of harmful mercury.

To provide efficient mixing of the light from a number of sources and a pleasing uniform light output, Advanced Optical Technologies, LLC (AOT) of Herndon, Va. has developed a variety of lighting fixture configurations that utilize light from a number of solid state sources. By way of example, a variety of structures for AOT's lighting systems are described in US Patent Application Publications 2007/0138978, 2007/0051883, 2007/0045524, 2009/0295266, and 2009/0296368, the disclosures of which are incorporated herein entirely by reference.

An example of a solid state light emitter 10 is shown in FIG. 1. A light source 12, such as an LED, is provided on a substrate 14 in a cavity of a reflector 16. The surface of the reflector 18 reflects and concentrates light emitted from the light source 12. Lead wires 20 connect the light source to electrodes 22 to carry electrical current to power the light source 12. The electrodes 22 are connected to an external power source (not shown). Appropriate materials for the LED 12 can be selected so that the device emits blue light. An example of a spectrum 28 of a blue light LED is shown in FIG. 2. As shown in FIG. 2, the peak emission of the blue light LED is at a wavelength of about 450 nm.

LEDs are available in a variety of colors depending on the semiconductor material used to fabricate the LED. LEDs can be produced which emit infrared, visible, and ultraviolet light. Typically, an LED emits light in a relatively narrow wavelength, thus light of substantially a single color is produced. Thus, LED lighting can cast an undesirable, unnatural-looking color over an area when used for general lighting. A lighting apparatus producing substantially white light for general lighting purposes would, therefore, be desirable. Substantially white light can be produced by using a phosphor in the LED package. Phosphors absorb excitation energy then re-emit the energy as radiation of a different wavelength. For example, a blue light absorbing phosphor can emit yellow light. The combination of blue light emitted by the light source and yellow light emitted by the phosphor can produce a substantially white light. Substantially white light can also be produced by combining LED lights of different colors, such as combining LEDs emitting red, green, and blue light. Such lighting apparatuses require the use of three different types of LEDs in a single lighting apparatus. In addition, the light in a LED lighting fixture typically passes across a plurality of different surfaces, resulting in internal reflections which both reduce light intensity and increased yellowing of the light, as light reflected back into a region containing phosphor undergoes additional wavelength shifting.

In view of the above shortcomings of LED lighting, it would be desirable to provide white light from a lighting apparatus using only one type of solid state light source. These developments not withstanding, in this age of ever increasing concern over energy consumption, there is always a need for techniques to provide lighting applications that are energy efficient, but which also can generate a visibly pleasing light distribution.

SUMMARY

Where a lighting device uses solid state emitters and an optic processes light from the emitters, it may improve efficiency in light extraction from the emitters to have an index of refraction matching material in between emitter output and a surface of solid of the optic that receives emitted light. However, such improved out-coupling or extraction efficiency may cause an overall color shift in the output of the overall lighting device, for example, if improved emitter output reduces internal reflection and associated internal phosphor excitation.

The teachings herein alleviate one or more of the above-noted problems with a solid state lighting device comprising a plurality of solid state light emitters, each configured for emitting light in a predetermined spectrum and an optic for combining light received from the plurality of solid state light emitters to form output light of the device. At least a portion of the optic for receiving light from the plurality of solid state light emitters is formed of a light transmissive solid having an index of refraction. An index matching material for matching the index of refraction of the light transmissive solid is provided in an optical path between a light emission output of at least one first solid state light emitter and each surface of the light transmissive solid arranged to receive light from the at least one first solid state light emitter. At least one second solid state light emitter is coupled to supply light to the light transmissive solid without any index matching material in an optical path between a light emission output of the at least one second solid state light emitter and each surface of the light transmissive solid arranged to receive light from the at least one second solid state light emitter.

Another aspect of the present disclosure is a lighting arrangement comprising a plurality of solid state light emitters on a circuit board. The plurality of solid state emitters comprise at least one first solid state light emitter comprising a first light source, a first cover portion through which light emitted from the light source is transmitted, and an index matching material in an optical path between the first light source and the first cover portion. At least one second solid state light emitter is provided comprising a second light source, a second cover portion through which light emitted from the second light source is transmitted, and without the index matching material in the optical path between the second light source and the second cover portion.

The present disclosure addresses the needs of providing visibly-aesthetic, energy-efficient lighting in an economical manner. The present disclosure provides a brighter, natural-looking white light using only a single type of solid state light emitter. To reduce the color shift in the output of the lighting device, the device may have index matching material used in association with one or some of the solid state light emitters but not all of the emitters, so that the combined light output of the device exhibits a desired spectral characteristics, e.g. remains a desirable color of white light. Additional advantages and novel features will be set forth in part in the description which follows, and in part will become apparent to those skilled in the art upon examination of the following and the accompanying drawings or may be learned by production or operation of the examples. The advantages of the present teachings may be realized and attained by practice or use of various aspects of the methodologies, instrumentalities and combinations set forth in the detailed examples discussed below.

BRIEF DESCRIPTION OF THE DRAWINGS

The drawing figures depict one or more implementations in accord with the present teachings, by way of example only, not by way of limitation. In the figures, like reference numerals refer to the same or similar elements.

FIG. 17 is a cross-sectional view of a solid state lighting device, having a solid-filled optical integrating cavity, which is useful in explaining several of the concepts discussed herein.

FIG. 18 is a cross-sectional view of a one-piece solid construction of the light transmissive structure, used in the device of FIG. 17.

FIG. 31 is a top plan view of the heat sink ring of the LED type lighting device of FIG. 17.

FIG. 32 is a side view of the heat sink ring of FIG. 31.

FIG. 33 an isometric view of the top of the heat sink ring of FIG. 31.

FIG. 34 an isometric view of the bottom of the heat sink ring of FIG. 31.

DETAILED DESCRIPTION

Figure 1:
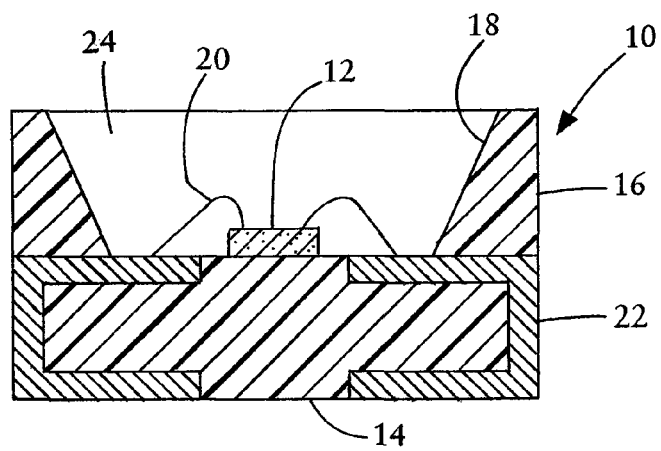
FIG. 1 is a cross-sectional view of a solid state light emitter without a material for changing the wavelength of the emitted light.

In the following detailed description, numerous specific details are set forth by way of examples in order to provide a thorough understanding of the relevant teachings. However, it should be apparent to those skilled in the art that the present teachings may be practiced without such details. In other instances, well known methods, procedures, components, and/or circuitry have been described at a relatively high-level, without detail, in order to avoid unnecessarily obscuring aspects of the present teachings.

In certain embodiments of the present disclosure, a solid state lighting device comprising a plurality of solid state light emitters, each configured for emitting light in a predetermined spectrum and an optic for combining light received from the plurality of solid state light emitters to form output light of the device. At least a portion of the optic for receiving light from the plurality of solid state light emitters is formed of a light transmissive solid having an index of refraction. An index matching material for matching the index of refraction of the light transmissive solid is provided in an optical path between a light emission output of at least one first solid state light emitter and each surface of the light transmissive solid arranged to receive light from the at least one first solid state light emitter. At least one second solid state light emitter is coupled to supply light to the light transmissive solid without any index matching material in an optical path between a light emission output of the at least one second solid state light emitter and each surface of the light transmissive solid arranged to receive light from the at least one second solid state light emitter.

In certain other embodiments of the disclosure, a lighting arrangement is provided comprising a plurality of solid state light emitters on a circuit board. The plurality of solid state emitters comprise at least one first solid state light emitter comprising a first light source, a first cover portion through which light emitted from the light source is transmitted, and an index matching material in an optical path between the first light source and the first cover portion. At least one second solid state light emitter is provided comprising a second light source, a second cover portion through which light emitted from the second light source is transmitted, and without the index matching material in the optical path between the second light source and the second cover portion.

Substantially white light can be obtained from a solid state lighting device or lighting arrangement according to the present disclosure using only one type of solid state light source. In certain embodiments of the present disclosure, a lighting device or arrangement comprising a plurality of solid state light emitters is provided which produces a substantially white light. The lighting device or arrangement may contain only a blue light LED as the light source. Semiconductor materials that can be used to produce blue light include zinc selenide (ZnSe), indium gallium nitride (InGaN), and silicon carbide (SiC) substrate LEDs. The substantially white light is provided by shifting the wavelength of a plurality of the blue light LEDs to a yellow light and combining the plurality of yellow-light shifted LEDs with a plurality of LEDs emitting blue light. The combination of blue light LEDs and yellow light LEDs produces a substantially white light as viewed by an observer.

Figure 2:
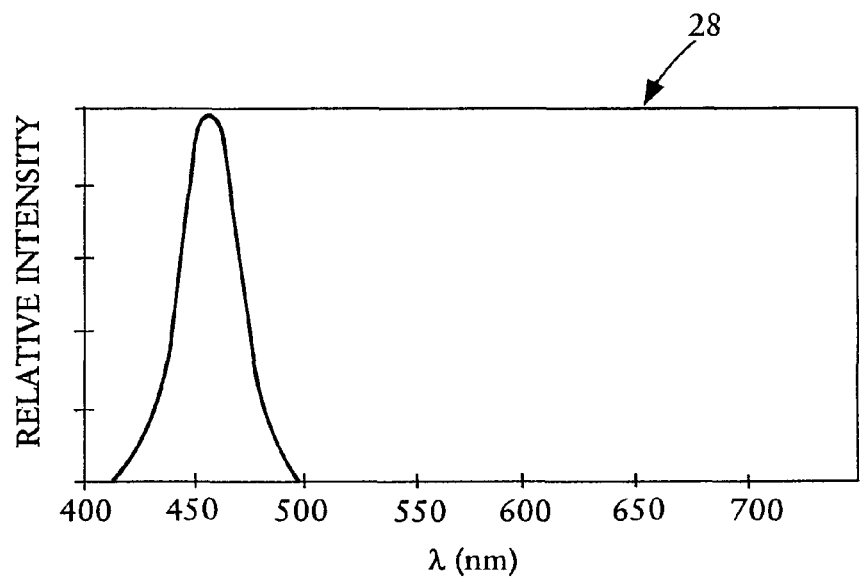
FIG. 2. illustrates a spectrum of the emitted light from a solid state light emitter without a material for changing the wavelength of the emitted light.
Figure 3:
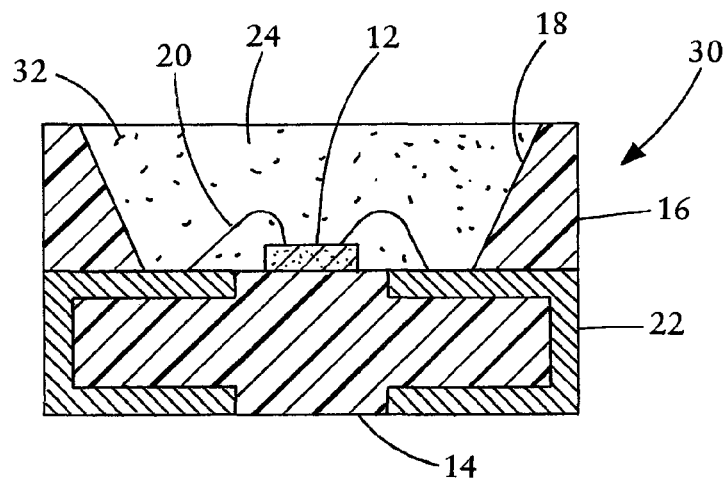
FIG. 3 is a cross-sectional view of a solid state light emitter including a material for changing the wavelength of the emitted light.
Figure 4:
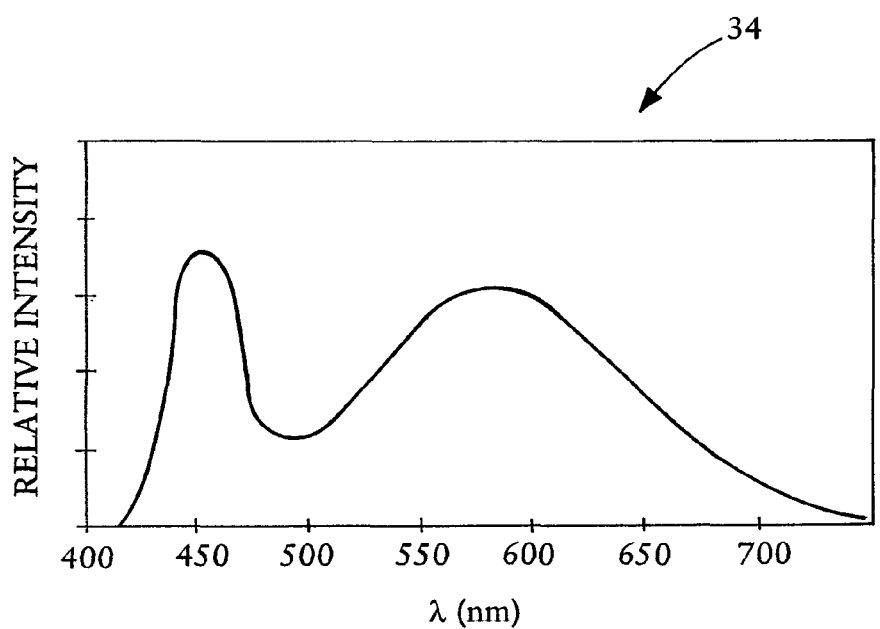
FIG. 4. illustrates a spectrum of the emitted light from a solid state light emitter with a material for changing the wavelength of the emitted light.

An example of a solid state light emitter which emits a yellow light 30 is shown in FIG. 3. A blue light solid state light source 12 is provided on a substrate 14 in a cavity 24 formed by a reflector 16. The surface of the reflector 18 reflects and concentrates light emitted from the light source 12. Lead wires 20 run from the light source to electrodes 22 to provide the electrical current to power the light source 12. The electrodes 22 are connected to an external power source (not shown). The cavity is substantially filled with a material for changing the wavelength of the emitted light 32. In certain embodiments, the material for changing the wavelength of emitted light is a phosphor 32. The phosphor 32 can be mixed into or coated onto a clear polymer, such as an epoxy or silicone, which substantially fills the cavity 24 and encapsulates the solid state light source 12. Phosphors absorb excitation energy then re-emit the energy as radiation of a different wavelength than the initial excitation energy. For example, some phosphors produce a down-conversion referred to as a "Stokes shift," in which the emitted radiation has less quantum energy and thus a longer wavelength. Other phosphors produce an up-conversion or "Anti-Stokes shift," in which the emitted radiation has greater quantum energy and thus a shorter wavelength. In an embodiment of the present invention, blue light emitted by the light source undergoes a Stokes shift when it is absorbed by the phosphor and is converted to yellow light. An example of a spectrum 34 of the yellow light solid state light emitter is shown in FIG. 4. As shown in FIG. 4, the relative intensity of the blue light emitted from the solid state light emitter 30 is reduced compared to the solid state light emitter with no material for changing the wavelength emitted light 10, illustrated in FIGS. 1 and 2. However, the solid state light emitter 30 containing the phosphor 32 has a broad peak centered in the yellow light region of the spectrum, unlike the solid state light emitter 10 without the phosphor 32. The combination of blue and yellow light produces a substantially white light.

Phosphors which can be used to produce the desired effect include a cerium-doped yttrium aluminum garnet (YAG), for example $Y_3Al_5O_{12}$:Ce. Other phosphors can include YAG doped with gadolinium (Gd), samarium (Sm), or gallium (Ga). The present disclosure is not limited to these specific phosphors which shift blue light to yellow light. In certain embodiments of the present disclosure where colored light is desired, other phosphors can be used, including $K_5Eu_{2.5}(WO_4)$ and $La_2O_2S$:Eu to provide red light; $(Ba,Sr)_2SiO_4$, ZnS:Cu,Al, and $BaMgAl_{10}O_{17}$:Eu, Mn to provide green light.

In order to reflect a large portion of incident light from the solid state light source 12 from the solid state light emitter a highly reflective material, such as aluminum (Al) can be deposited on the surface 18 of the reflector 16.

Figure 5:
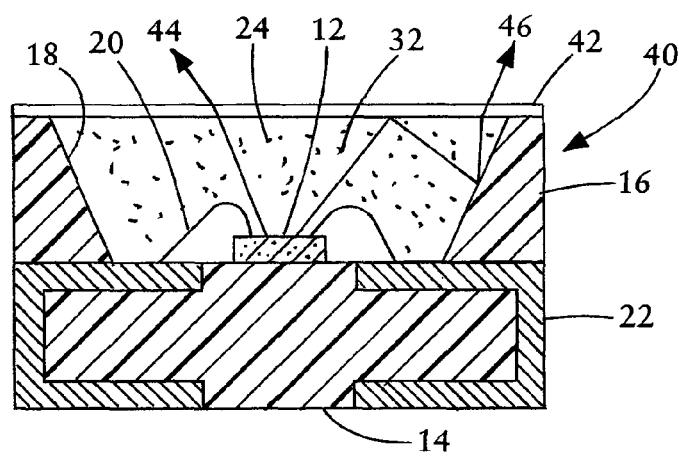
FIG. 5 is a cross-sectional view of a solid state light emitter including a material for changing the wavelength of the emitted light and a cover.
Figure 6:
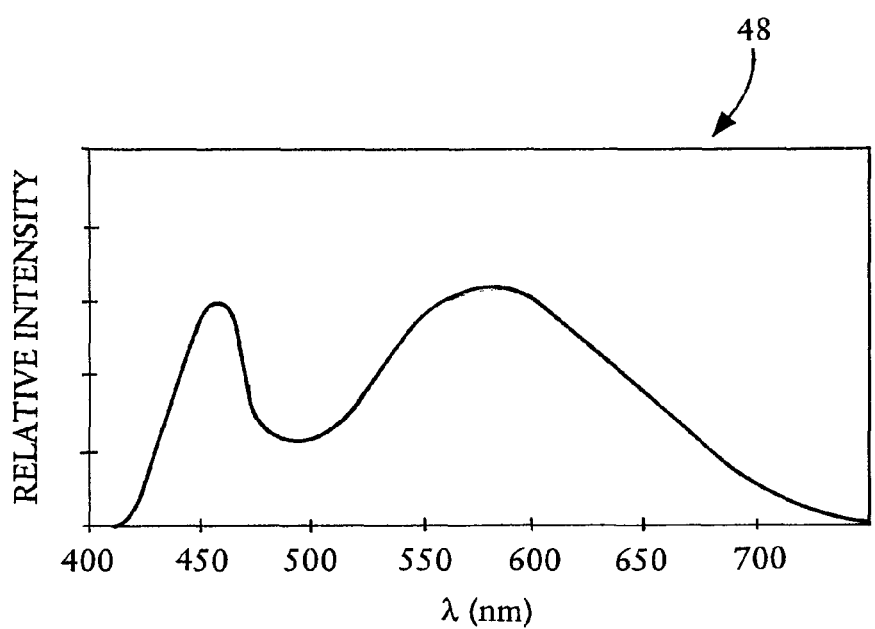
FIG. 6 illustrates a spectrum of the emitted light from a solid state light emitter with a material for changing the wavelength of the emitted light and a cover.

To protect the solid state light emitter, a cover 42 is used to cover the solid state light source 12 and material for changing the wavelength of the emitted light 32. An example of solid state light emitter 40 with a cover is shown in FIG. 5. The cover 42 is a translucent or transparent material. The cover 42 can comprise such translucent or transparent materials such as a glass, a ceramic, or a polymer including a polyacrylic, a polycarbonate, and a silicone. The use of a cover 42 can result in refraction and internal reflection of light emitted from the solid state light source 12 because of the difference in the index of refraction of the cover 42 and the external ambient. As illustrated in FIG. 5, a portion of the light 44 is transmitted through the cover 42. Another portion of the emitted light 46, on the other hand, is reflected off the cover 42, reflected off the surface 18 of the reflector 16, and then subsequently transmitted through the cover. The multiple internal reflections of the another portion of emitted light 46 results in a longer pathway of the light through the material for changing the wavelength of the emitted light 32. Thus, the probability of the light striking a phosphor particle increases. As shown in FIG. 6, this increased probability of the light striking a phosphor particle, increases the relative intensity of yellow light being emitted and decreases the relative intensity of the blue light.

Figure 7:
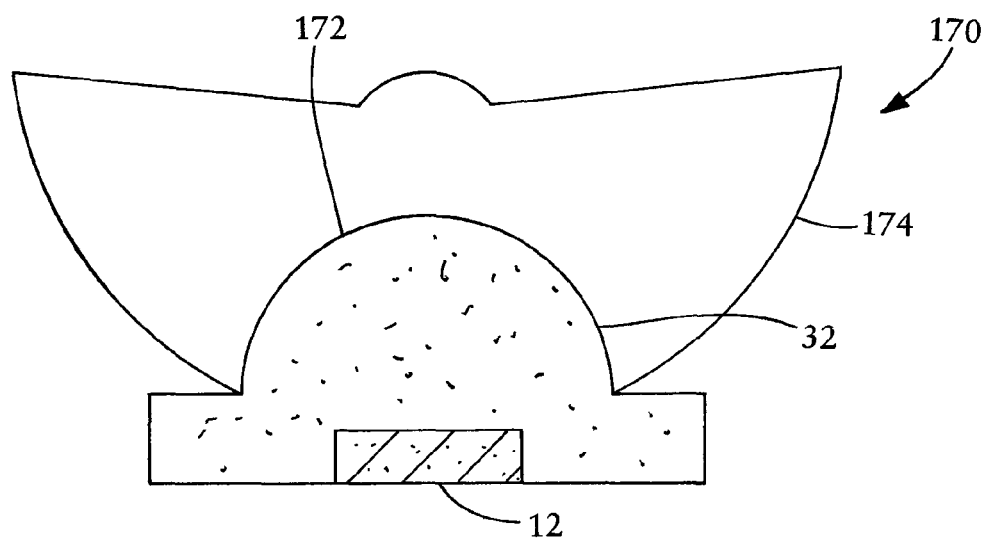
FIG. 7 is a cross-sectional view of a solid state light emitter with a dome-shaped cover.

In certain embodiments of the present disclosure, the cover 42 is planar, as shown in FIG. 5. The thickness of the cover 42 is depicted as a relatively thin sheet for illustrative purposes. The cover 42 can be much thicker in the actual device. Thicker covers may provide reduced total internal reflection, unless the light is introduced at a shallow angle to the cover/air interface. In other embodiments, the cover 172 is dome-shaped, as shown in FIG. 7. The solid state light emitter depicted in FIG. 7 comprises the material for changing the wavelength of the emitted light 32 substantially filling the interior of the dome-shaped cover 172 and a reflector 174 surrounding the cover 172.

Figure 8:
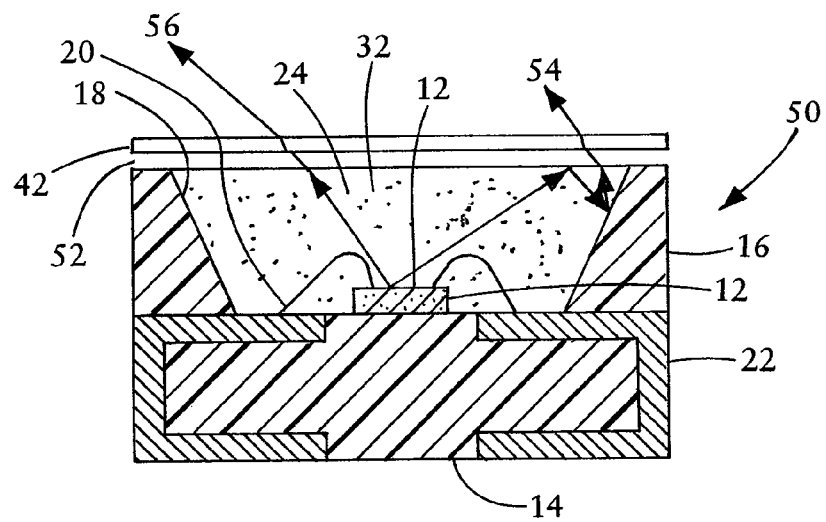
FIG. 8 is a cross-sectional view of a solid state light emitter including a material for changing the wavelength of the emitted light and a gap between the material for changing the wavelength of the emitted light and a cover.
Figure 9:
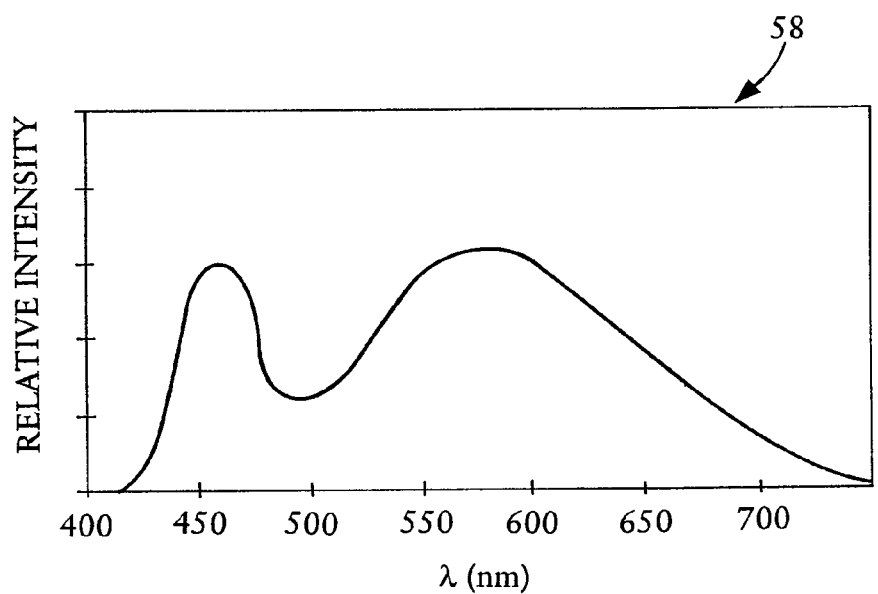
FIG. 9 illustrates a spectrum of the emitted light from a solid state light emitter with a material for changing the wavelength of the emitted light and a gap between the material for changing the wavelength of emitted light and a cover.

Increased internal reflection and refraction of emitted light can occur by spacing the cover 42 apart from the rest of the solid state light emitter 50 forming an air gap between the cover 42 and remaining portion of the emitter 50, as shown in FIG. 8. The increased internal reflection is caused by the difference in the index of refraction between the material for changing the wavelength of light of the emitted light 32 and the air gap 52, as shown by light ray 54; and the difference in the index of refraction between the air gap 52 and the cover 42, as illustrated by light ray 56. In addition, the difference in the index of refraction between the cover 42 and the external air can also cause internal reflection and/or refraction. The multiple pathways for internal reflections increases the number of light rays that can interact with the material for changing the wavelength of light 32, thus shifting a greater amount of the emitted blue light towards yellow light. As shown in the spectrum 58 in FIG. 9, the relative intensity of the yellow light peak increases and peak of the emitted blue light decreases as compared to the spectrum in FIG. 6, in which there was not an air gap in the emitter 50.

Typically an air ambient is on the opposing side of the cover 42 from the solid state light source 12. However, in certain embodiments of the present disclosure, the ambient may be something other than air, such as water. A lighting device according to the present disclosure can be used as pool or spa lighting, or can be used for waterfront lighting, such as under a dock.

While internal reflections increase the yellow content of the emitted substantially white light, they also reduce the total overall light emitted from the device. It would be desirable to maintain a high intensity of the total light emitted to provide sufficient illumination for general lighting applications. The total intensity of emitted light can be increased by the use an index matching material 62 between the light source 12 and the cover 42. Suitable index matching materials 62 can comprise a silicone. The index matching material 62 allows light to pass through the cover without being internally reflected, thus a greater amount of light is transmitted through the cover 42. In certain embodiments, the index matching material 62 is deposited on surface of a light transmissive solid, such as a surface of the cover 42, in the optical path of the emitted light. The index matching material 62 can be an adhesive that adheres the solid state light emitter to a light transmissive solid, such as the cover 42. In certain embodiments, the index matching material has substantially the same index of refraction as the cover 42.

Figure 10:
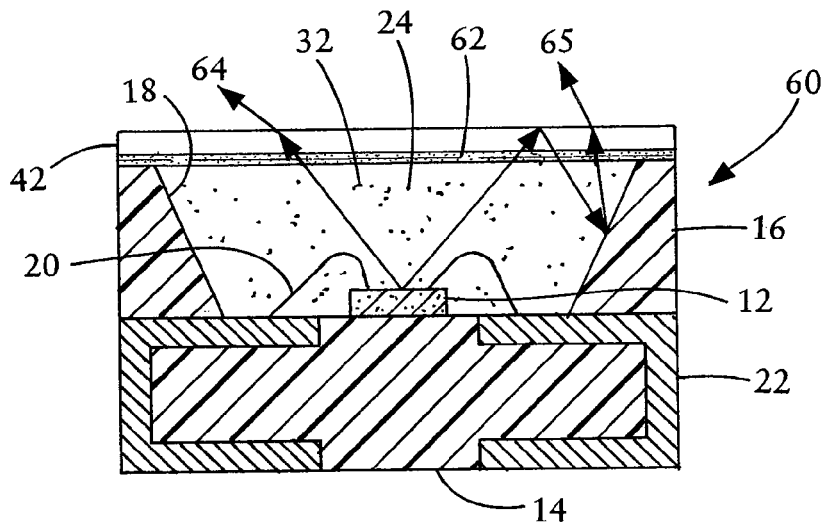
FIG. 10 is a cross-sectional view of a solid state light emitter including a material for changing the wavelength of the emitted light, index matching material, and a cover.
Figure 11:
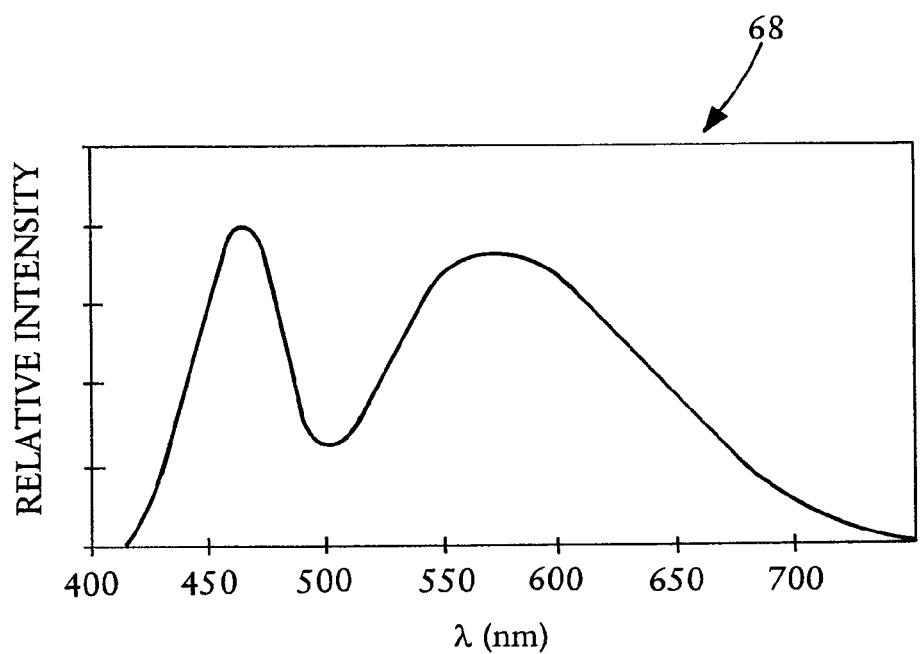
FIG. 11 illustrates a spectrum of the emitted light from a solid state light emitter with a material for changing the wavelength of the emitted light, index matching material, and a cover.
Figure 12:
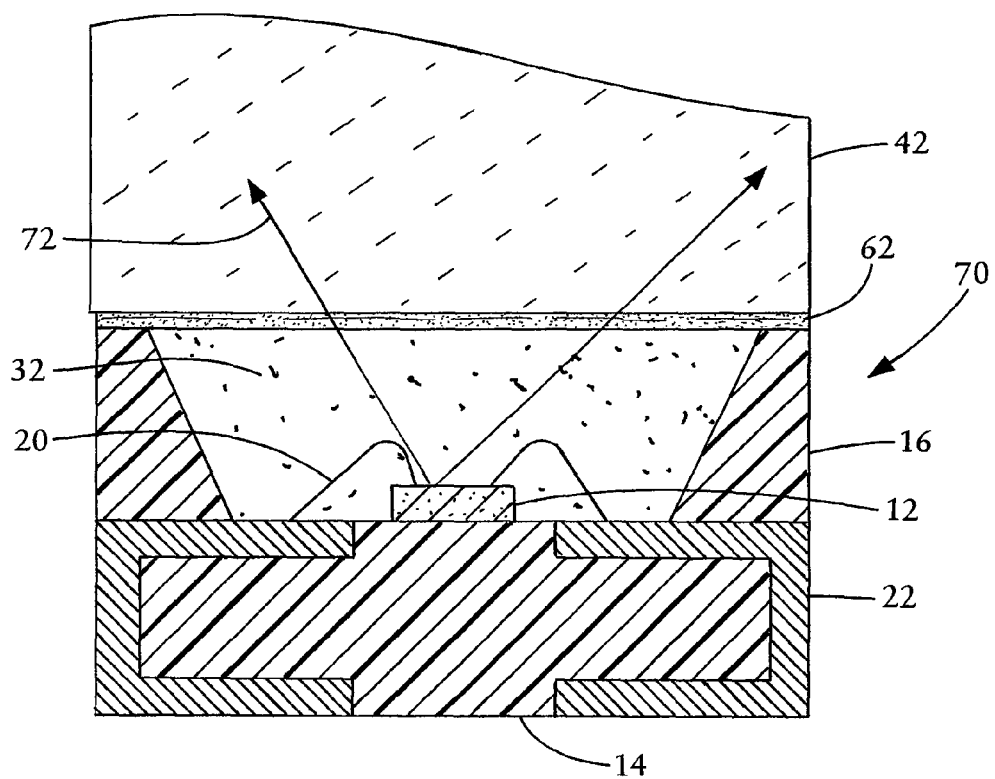
FIG. 12 is a cross-sectional view of a solid state light emitter including a material for changing the wavelength of the emitted light, index matching material, and a thick cover.

FIG. 10 illustrates an embodiment of the present disclosure which has both an index matching material 62 and a material for changing the wavelength of the emitted light 32. As shown in FIG. 10, light ray 64 is transmitted through the cover 64 without being reflected. Thus, the total intensity of the light emitted by the device 60 is increased, as illustrated in the spectrum 68 of FIG. 11. However, a light ray 65 can still be reflected at the cover 42/external air interface. In addition, the light rays 64, 65 can still be refracted at a cover 42/external air interface. The use of an index matching material 62 and a material for changing the wavelength of emitted light 32 provides a brighter, substantially white light for general lighting purposes. In certain embodiments of the present disclosure, the material for changing the wavelength of emitted light 72 can be deposited on the cover 42. On the other hand, in a lighting device 70 using the index matching material 62 with a thicker cover 42, as shown in FIG. 12, such as an optical element, light rays 72 pass into the optical element without reflection or refraction.

Figure 13:
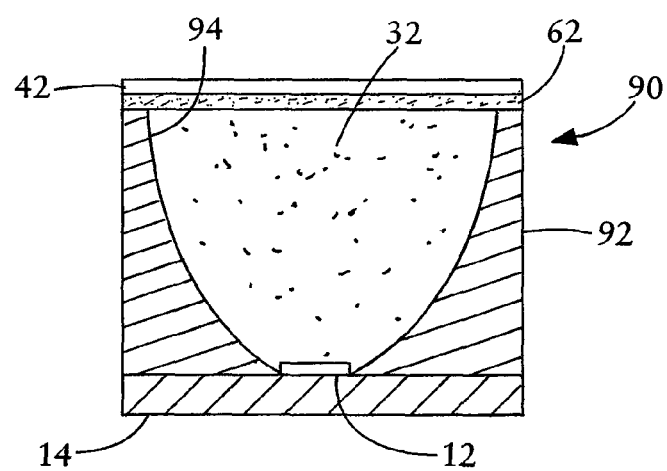
FIG. 13 is a cross-sectional view of a solid state light emitter with a parabolic reflector.

In certain embodiments of the present disclosure, the reflector 92 can have a parabolic reflecting surface 94, as shown in the embodiment of FIG. 13. Parabolic reflectors concentrate and amplify the amount of light transmitted through the cover 42 increasing the brightness of the light produced by the lighting apparatus.

Figure 14:
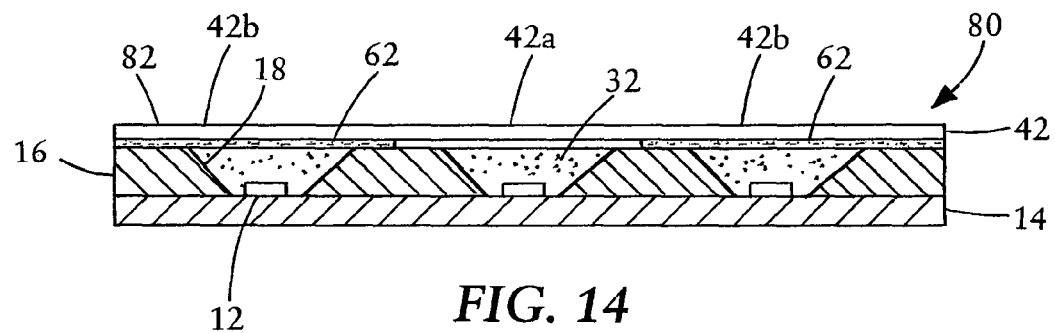
FIG. 14 is a cross-sectional view of an array of solid state light emitters.
Figure 15:
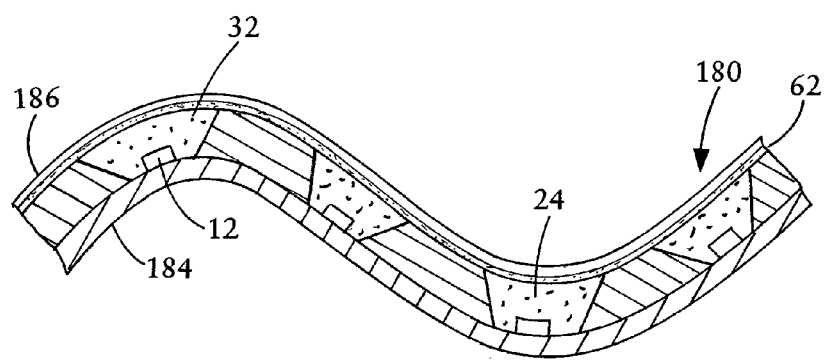
FIG. 15 is a cross-sectional view of array of solid state light emitters on a flexible substrate.

In certain embodiments of the present disclosure, the lighting arrangement 80 comprises a planar array 82 of a plurality of solid state emitters. FIG. 14 is a cross-sectional view of a portion of a planar array according to an embodiment of the present disclosure. In this embodiment, the plurality of solid state light emitters share a common substrate 14 and cover 42. In certain embodiments the common cover 42 can comprise first and second cover portions 42a, 42b, wherein the first cover portion 42a does not have a layer of index matching material, while the second cover portion 42b has a layer of index matching material 62 deposited thereon. Alternatively, the first and second cover portions 42a, 42b can be separate, discrete covers. The substrate 14 can be either a rigid, flat substrate or a flexible substrate. FIG. 15 depicts an array 180 of solid state light sources 12 formed on a flexible substrate 184. The flexible array 180 includes a flexible cover 186, a layer of index matching material 62, and material for changing the wavelength of the emitted light 32 substantially filling the cavity 24 between the light source 12 and cover 186. The substrate 184 can comprise any suitable flexible polymer, including a silicone. The cover 186 can comprise any transparent or translucent flexible polymer, including a silicone.

Figure 16:
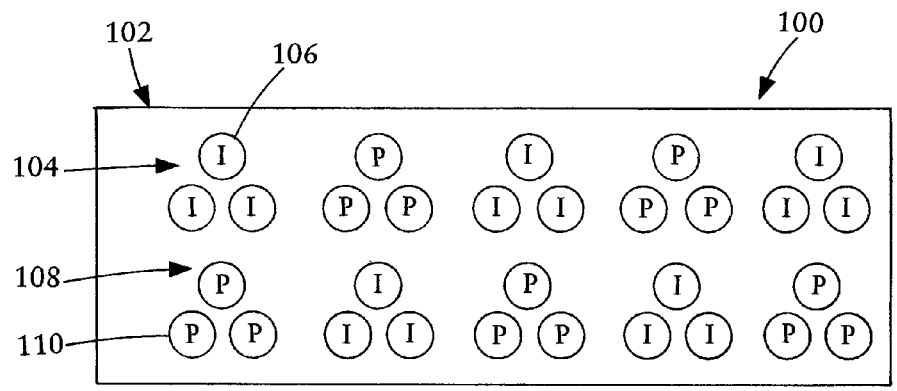
FIG. 16 is a plan view array of solid state emitters comprising solid state light emitters according to an embodiment of the present invention.

A plan view of a lighting arrangement 100 having an array 102 of a plurality solid state light emitters according to the present disclosure is shown in FIG. 16. The array 102 comprises a plurality of first solid state light emitters 1106 containing an index matching material and a plurality of second solid state light emitters P 110 not containing an index matching material. An array according to the present disclosure can comprise as few as two solid state light emitters, one I 106 and one P 110, to hundreds of solid state light emitters.

The present disclosure allows the tuning of the color and brightness of the light emitted from the lighting apparatus by varying the number of solid state light emitters comprising: the index matching material, the material for changing the wavelength of the emitted light, and both materials. For example, the ratio of solid state light emitters containing the index matching material to the solid state light emitters not containing the index matching material can be varied in order to tune the emitted color of the substantially white light. If there are a greater number of solid state emitters without the index matching material in the optical path, the emitted light will appear yellower than when the number of solid state light emitters containing the index matching material in the optical path is greater than the number of solid state light emitters not containing the index matching material. Further, a greater number of solid state light emitters containing the index matching material in the optical path would both increase the brightness, as less light would be internally reflected. Alternatively, a greater number of solid state light emitters containing a yellow phosphor would shift the emitted light towards the yellow region of the spectrum.

In addition, the color of the light can also be tuned according to the present disclosure by using a different color phosphor, such as a red or green phosphor, in addition to, or in place of the yellow phosphor, as the material for changing the wavelength of the emitted light. Thus, the present disclosure provides a methodology for fine tuning the color of the substantially white light emitted by the lighting apparatus. In certain embodiments, the present disclosure provides methodology for producing light of a wide range of colors, in addition to white light, using only one type of solid state light source, by appropriate selection of phosphors and the ratio of solid state light emitters including the index matching material to solid state light emitters without the index matching material.

Although the solid state light emitters 106, 110 in the apparatus of FIG. 16 are depicted as clustered in groups of three 104, 108 the solid state light emitters can be arranged in any suitable manner.

In certain embodiments of the present disclosure, the number of solid state light emitters in the array 102 ranges from 2 to 1000. In certain embodiments, the number of solid state light emitters ranges from 10 to 100. In certain embodiments, the number of solid state light emitters ranges from 20 to 50. In certain embodiments, the number of solid state light emitters is about 30.

In certain embodiments of the present disclosure, all the solid state emitters contain the material for changing the wavelength of the emitted light. In other embodiments, at least one of the solid state light emitters do not contain the material for changing the wavelength of the emitted light.

In certain embodiments of the present disclosure, the ratio of solid state light emitters containing index matching material located in the optical path between the light emitter and the light transmissive structure to solid state light emitters not containing the index matching material in the optical path between the light emitter and light transmissive structure ranges from 70:30 to 30:70. In certain embodiments, the ratio ranges from 60:40 to 40:60. In certain embodiments, the ratio is about 50:50.

In certain embodiments of the present disclosure, solid state lighting arrangements can be configured into solid state lighting device. Various concepts discussed below relate to heat sink and circuit board arrangements for solid state type lighting device. Each device has an optic (or primary optic). The optic comprises an optical cavity formed by a light transmissive volume, which for example may be filled with a liquid or a solid, a reflector covering a substantial portion of a contoured surface of the light transmissive structure that forms the volume of the cavity. The optic can further comprise a mask adjacent the light transmissive structure. A flexible circuit board is mounted on a heat sink member. One or more tabs of the flexible circuit board provide support and electrical connection for one or more solid state light emitters. When installed in the fixture, each tab bends to locate the emitter(s) between the light transmissive structure and the tab/heat sink member. In the examples, variations of this arrangement press one or more of the solid state light emitters against a periphery of the light transmissive structure forming the volume for the optical cavity. In at least one example, the periphery comprises an angled surface. The emitter contact provides optical coupling of light from each emitter into the optical volume of the optic for diffuse reflection in the cavity. However, the positioning between the light transmissive structure and the heat sink member also facilitates heat transfer from the emitters to the heat sink, and thus dissipation of the heat generated during operation of the lighting device.

Figure 19:
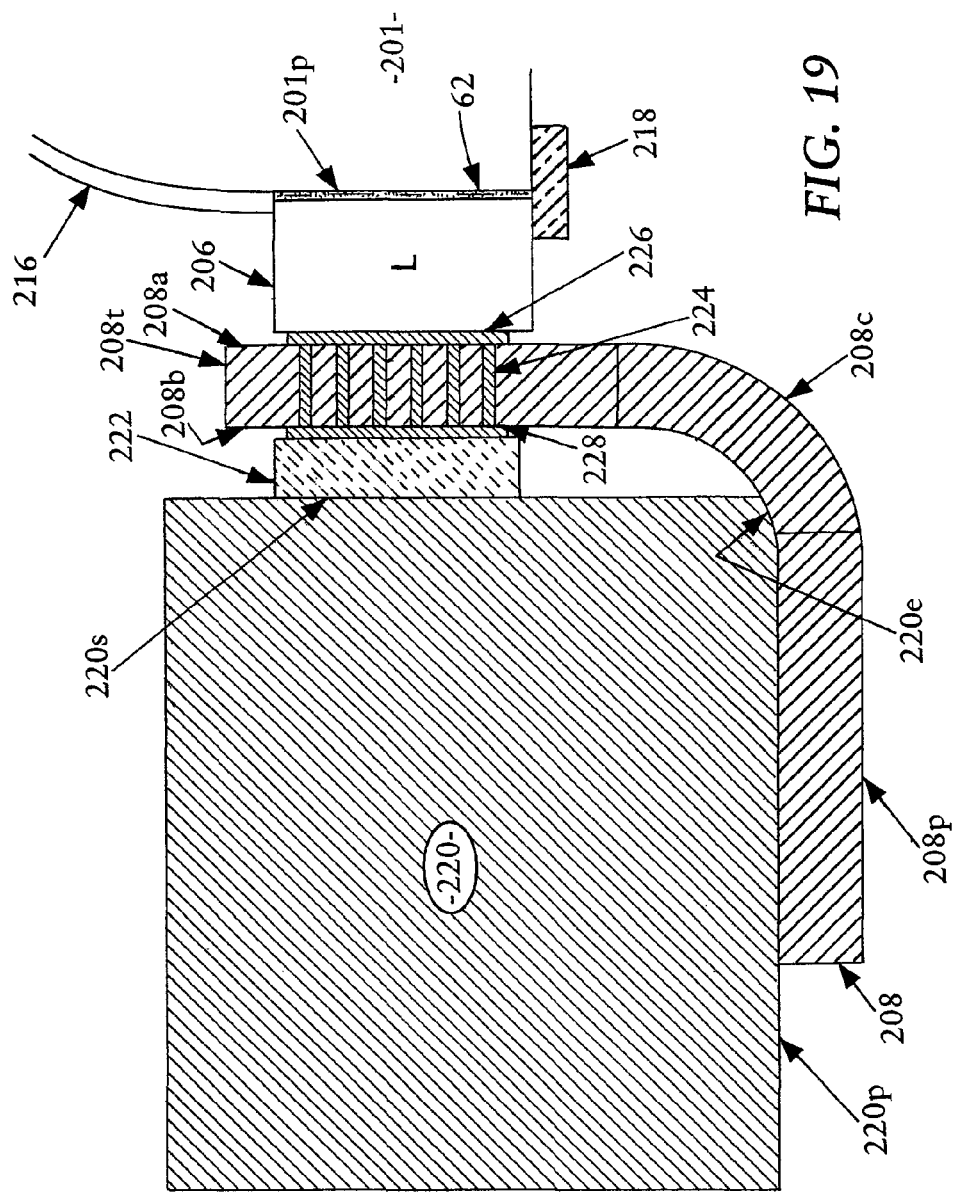
FIG. 19 is an enlarged portion of the cross-section of a lighting device, showing several elements of the fixture in more detail.
Figure 20:
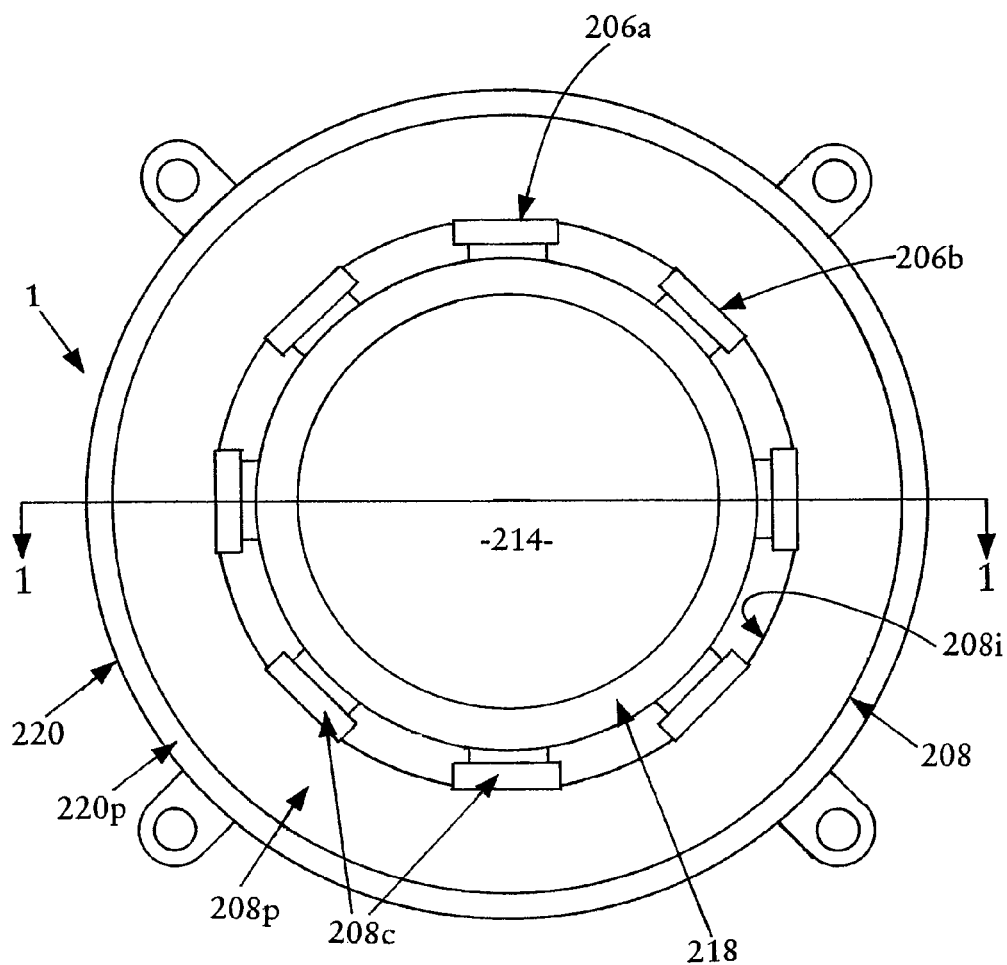
FIG. 20 is a bottom view of a solid state light fixture of FIG. 17, showing a several elements of the device in more detail.

Reference now is made in detail to the examples illustrated in the accompanying drawings and discussed below. FIG. 17 is a somewhat stylized representation of a cross-section of a first example of a lighting device, light fixture, or "light engine" apparatus 200 intended for general lighting, for example, in a region or area intended to be occupied by a person. FIG. 18 is a cross-sectional view of the optic 203 comprising a one-piece solid construction of the light transmissive structure 201 that forms the optical volume 202, in the lighting device 200 of FIG. 17. FIG. 19 is a detailed/enlarged view of a portion an embodiment of a general lighting device, useful in explaining aspects of the flexible circuit board 208 and heat sink member 220. FIG. 20 is a bottom view ('bottom' in terms of the exemplary downlight orientation) an embodiment of a general lighting fixture. These and other drawings are not drawn to scale. In most of the examples, for convenience, the lighting device is shown in an orientation for emitting light downward. However, the apparatus may be oriented in any desired direction to perform a desired general lighting application function.

Figure 35:
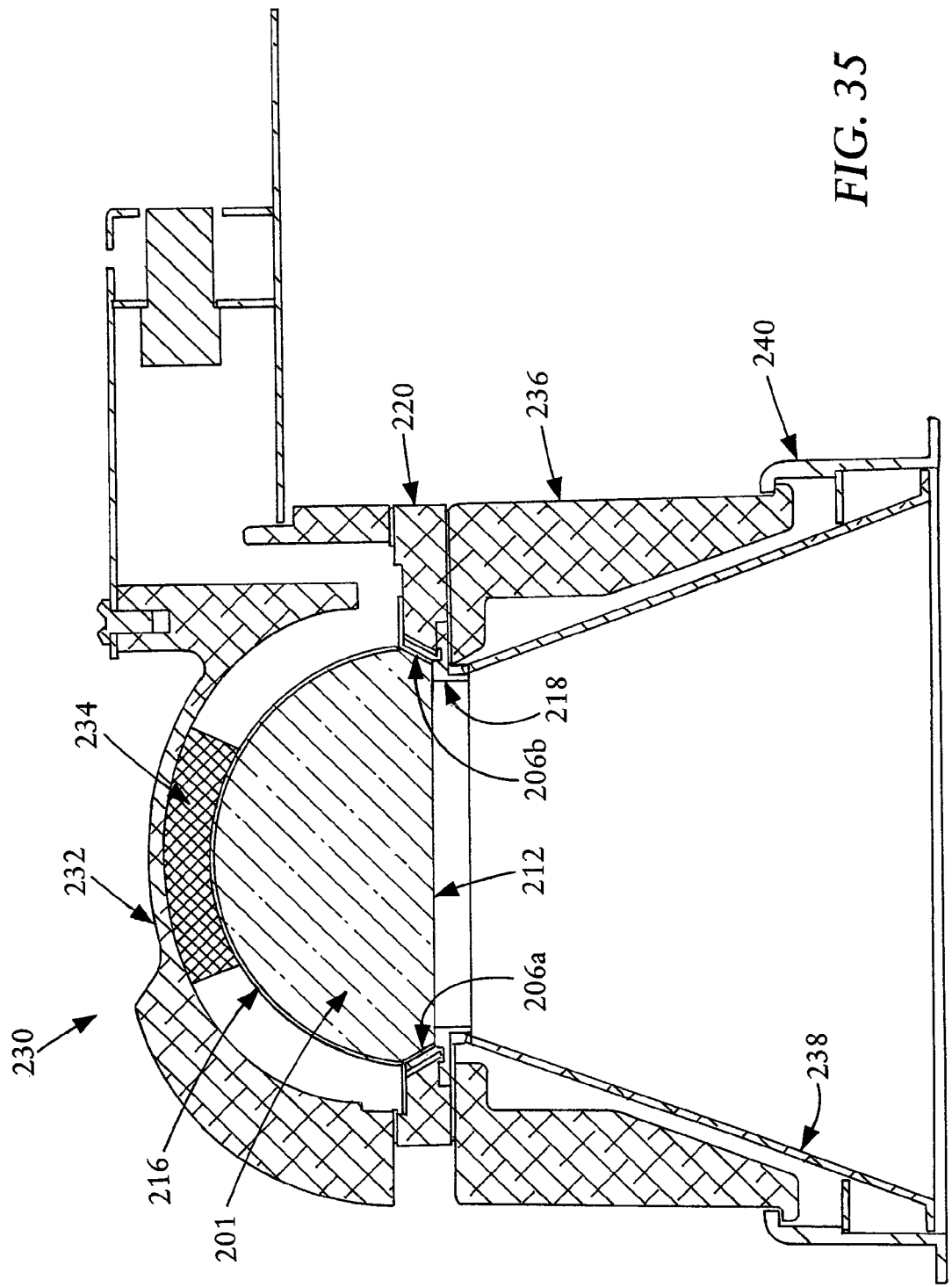
FIG. 35 a cross-sectional view of a light incorporating the engine or device of FIG. 17 with housing components and a secondary optic, in this case, a reflector coupled to the aperture.

The device 200 could be used alone to form a lighting device or more likely would be used with other housing elements and possibly with a secondary optic (e.g. such as shown in FIG. 35) to form the overall lighting device commercial product. Together with the other electrical components (e.g. as in FIG. 36), the device or "light engine" 200 of FIG. 17 or the commercial device of FIG. 35 would form a lighting system.

Examples of general lighting applications include downlighting, task lighting, "wall wash" lighting, emergency egress lighting, as well as illumination of an object or person in a region or area intended to be occupied by one or more people. A task lighting application, for example, typically requires a minimum of approximately 20 foot-candles (fcd) on the surface or level at which the task is to be performed, e.g. on a desktop or countertop. In a room, where the light fixture 1 is mounted in or hung from the ceiling or wall and oriented as a downlight, for example, the distance to the task surface or level can be 35 inches or more below the output of the light fixture. At that level, the light intensity will still be 20 fcd or higher for task lighting to be effective.

The device 200 includes a light transmissive structure 201 forming a volume 202. As shown in FIG. 18, the structure 201 has a contoured outer surface 201c and an optical aperture surface 212. At least an outer peripheral portion 201p of the structure 201 along the contoured surface 201c is substantially rigid. In this embodiment, the surface 201c corresponds to a segment of a sphere somewhat less than a hemisphere and does not extend continuously to the periphery of the aperture surface 212. In this embodiment, the peripheral optical coupling surface 201p forms an obtuse angle with respect to the optical aperture surface 212 (and an acute angle with respect to the vertical in the downlight orientation of FIG. 17). At least the outer peripheral portion 201p of the structure 201 along the lower portion of contoured surface 201c is substantially rigid. The contoured surface 201c, at least in regions where there is no contact to the solid state light emitter 206a, 206b, has a roughened or etched texture. In the embodiments of FIGS. 17, 18, and 25 to 30, the outer surfaces of the structure 201 approach or approximate a hemisphere that is somewhat truncated at the peripheral region by the angled surface 201p. The optical aperture surface indentified by number 212 approximates a circle. Examples having shapes corresponding to a portion or segment of a sphere or cylinder are preferred for ease of illustration and/or because curved surfaces provide better efficiencies than other shapes that include more edges and corners which tend to trap light. Those skilled in the art will understand, however, that the volume of the light transmissive structure, and thus the optical cavity 202 of the device or light engine 200, may have any shape providing adequate reflections within the volume/cavity for a particular application. For example, the contour of the upper surface 201c may be hemispherical, may correspond in cross section to a segment of a circle less than a half circle (less than hemispherical), or may extend somewhat further than a hemisphere to correspond in cross section to a segment of a circle larger than a half circle. Also, the contoured portion 201c may be somewhat flattened or somewhat elongated relative to the illustrated axis of the aperture 214, the aperture surface 212 and the exemplary solid 201 (in the vertical direction in the exemplary downlight orientation depicted in FIG. 17). The coupling surface 201p is shown having a substantially flat cross-section, although of course it would curve around the circular structure 201. However, other shapes or contours for the surface 201p may be used, for example, with a convex cross section or concave cross-section or with indentations to receive emitting surfaces or elements of the first LED 206a comprising an index matching material in an optical path through which light is emitted from the light source to the light transmissive structure 201, and the second LED 206*b*, without the index matching material in the optical path through which light is emitted from the light source. Thus, the second LED 206*b* does not contain the index matching material in the optical path through which light is emitted to the light transmissive structure 201.

In the example, the aperture surface 212 is shown as a flat surface. However, those skilled in the art will recognize that this surface 212 may have a convex or concave contour. Typically, the surface 212 is clear-transparent, although the surface could have a diffusely translucent finish or be covered by a transmissive white diffuser or the like.

Although other arrangements of the light transmissive structure are included within the scope of the present disclosure, in this embodiment, the light transmissive structure forming the volume 202 comprises a one piece light transmissive solid 201 substantially filling the volume 202. Materials containing phosphors may be provided within or around the solid. In the embodiment of FIGS. 17 to 20, the solid 201 is a single integral piece of light transmissive material. The material, for example, may be a highly transmissive and/or low absorption acrylic having the desired shape. In this embodiment, the light transmissive solid structure 201 is formed of an appropriate glass. In certain embodiments, the light transmissive structure 201 may include materials other than glass, including polyacrylates, polycarbonates, and liquid filled glass, polyacrylates, and polycarbonates.

The glass used for the solid of structure 201 in the exemplary device 200 of FIG. 17 is at least a BK7 grade or optical quality of glass, or equivalent. For optical efficiency, it is desirable for the solid structure 201, in this case the glass, to have a high transmissivity with respect to light of the relevant wavelengths processed within the optical cavity 202 and/or a low level of light absorption with respect to light of such wavelengths. For example, in an implementation using BK7 or better optical quality of glass, the highly transmissive glass exhibits 0.99 internal transmittance or better (BK7 exhibits a 0.992 internal transmittance).

The device 200 also includes a reflector 216, which has a diffusely reflective interior surface 216*s* extending over at least a substantial portion of the contoured outer surface 201*c* of the light transmissive structure 201. For optical efficiency, there is little or no air gap between the diffusely reflective interior surface 216*s* of the reflector 216 and the corresponding portion(s) of the contoured outer surface 201*c* of the light transmissive structure 201. In this way, the diffuse reflective surface 216*s* forms an optical cavity from and/or encompassing the volume 202 of the light transmissive structure 201, with an optical aperture 214 formed from a portion or all of the aperture surface 212 of the light transmissive structure 201.

It is desirable that the diffusely reflective surface(s) 216*s* of the reflector 216 have a highly efficient reflective characteristic, e.g. a reflectivity equal to or greater than 90%, with respect to the relevant wavelengths. Diffuse white materials exhibiting 98% or greater reflectivity are available, such as Spectralon® and Duraflect®. In certain embodiments, Valar® is used as the reflector 216. Valar® initially comes in flat sheet form but can then be vacuum formed into desired shapes, in this case, into a dome shape conforming to the contoured outer surface 201*c* of the light transmissive structure 201. Those skilled in the art will recognize that other materials may be utilized to construct the reflector 216 to have the desired shape and optical performance. Various reflective paints, powders and sheet materials may be suitable. The entire interior surface 216*s* of the reflector 216 may be diffusely reflective, or one or more substantial portions may be diffusely reflective while other portion(s) of the surface may have different light reflective characteristics, such as a specular or semi-specular characteristic.

At least a portion 214 (FIG. 17) of the aperture surface 212 of the light transmissive structure 201 serves as a transmissive optical passage or effective "optical aperture" for emission of integrated light, from the optical integrating volume 202, in a direction to facilitate the particular general lighting application in the region or area to be illuminated by the light fixture (generally downward and/or outward from the fixture in the orientation of FIG. 17). The entire surface 212 of the solid structure 201 could provide light emission. However, the example of FIG. 18 includes a mask 218 having a reflective surface facing into the optical integrating volume 202, which somewhat reduces the surface area forming the transmissive passage to that portion of the surface shown at 214. The optical volume 202 operates as an optical integrating cavity (albeit one filled with the light transmissive solid of structure 201), and the passage 214 for light emission forms the optical aperture of that cavity.

The surface of the mask 218 that faces into the optical integrating volume 2 (faces upward in the illustrated orientation) is reflective. That surface may be diffusely reflective, much like the surface 216*s*, or that mask surface may be specular, quasi specular or semi-specular. Other surfaces of the mask 218 may or may not be reflective, and if reflective, may exhibit the same or different types/qualities of reflectivity than the surface of the mask 218 that faces into the optical integrating volume 202.

The lighting device 200 also includes a plurality of solid state light emitters, including at least one first solid state light emitter 206*a* containing an index matching material in an optical path through which light is emitted to the light transmissive structure 201, and at least one second solid state light emitter 206*b* not containing an index matching material in an optical path through which light is emitted, which provide light intensity sufficient for a particular general lighting application intended for the light fixture. As the index matching material 62, an optical grease, glue or gel of an appropriate refractive index may be applied between the light emitting surfaces of the LED type solid state emitters 206*a* and the corresponding segments of the outer peripheral portion 201*p* along the contoured surface 201*c* of the light transmissive structure 201. The index matching material 62 may be a silicone. Use of the index matching material improves optical extraction of light from the package encapsulating the LED chip and thus the coupling of light from each emitter into the light transmissive structure 201. The index matching material 62 is applied to regions of the outer peripheral portion 201*p* opposing the first solid state light emitters 206*a* along the contoured surface 201*c* of the light transmissive structure 201. The index matching material is not applied to the regions of outer peripheral portion 201*p* opposing the second solid state light emitters 206*b*. The solid state light emitters 206*a*, 206*b* can be any appropriate type of light emitting semiconductor based device discussed herein. In the specific embodiments discussed herein the solid state light emitters are light emitting diodes (LEDs).

The exemplary lighting device 200 also includes a flexible circuit board 208. As shown in greater detail in an embodiment of the disclosure in FIG. 19, the flexible circuit board 208 has a mounting section or region 208*p* that is at least substantially planar (and is therefore referred to herein as a "planar" mounting section) for convenience in this example. As shown in the bottom view of FIG. 20, the planar mounting section 208*p* has an inner peripheral portion 208*i*. In this first example, the solid forming the light transmissive structure 201 is roughly or substantially hemispherical, and the lower periphery is circular. The inner peripheral portion 208i of the flexible circuit board 208 has a shape substantially similar to the shape of the outer periphery 201p of the light transmissive structure 201, that is to say a circular shape in the example. The circular inner peripheral portion 208i of the flexible circuit board 208 has a size slightly larger than the circular outer peripheral portion of the light transmissive structure 201. The flexible circuit board 208 also has flexible tabs 208t (FIGS. 17 and 19) attached to and extending from the inner peripheral region of the flexible circuit board 208. As is shown in FIGS. 19 and 20, a portion 208c of each tab forms a curve.

In certain embodiments, the number and type of LED type solid state light emitters 206a, 206b used in the fixture are selected so as to produce a substantially white light with intensity sufficient for a general lighting application of the lighting device 200. The emitters 206a, 206b are mounted on the tabs 208t. At least one of each of the first and second solid state light emitters 206a, 206b is mounted on a first surface 208a of each of the tabs 208t of the flexible circuit board 208.

The device 200 also includes a heat sink member 220. The heat sink member 220 is constructed of a material with good heat conduction properties and sufficient strength to support the flexible circuit board and associated LED light emitters, typically a metal such as aluminum. Although not shown, cooling fins may be coupled to the heat sink member 220.

The heat sink member 220 has an inner peripheral portion of substantially similar shape and of a size slightly larger than the outer peripheral portion 201p of the light transmissive structure 201, in this case, a circular inner peripheral portion. Hence, in the example of FIGS. 17 to 19, the heat sink member 220 is essentially a ring configured to surround the light transmissive structure 201. The inner periphery of the heat sink member 220, e.g. at inner edge 220e and/or surface 220s, corresponds in shape to the shape of the outer periphery 201p of the light transmissive structure 201. The outer periphery of the heat sink member 220 may have any convenient shape, although in the example, it is essentially circular with a number of eyelets for screws or other fasteners to mount the fixture (see FIG. 20).

The ring shaped heat sink member 220 in certain embodiments is a single solid member. Those skilled in the art will realize that other configurations may be used. For example, there may be a cut on one side of the ring and a tightening member (e.g. screw or bolt) attached through extensions or shoulders on either side of the cut to provide adjustment or tightening of the ring shaped heat sink member 220 around the outer periphery of the hemispherical light transmissive structure 201. Another approach would be to utilize a two or three piece arrangement of the heat sink member 220 with fasteners to couple the pieces of the member to form the ring around the outer periphery of the hemispherical light transmissive structure 201. A variety of shapes/contours may be used for the heat sink member instead of the relatively flat or planar ring shown and discussed by way of example here.

As assembled to form the lighting device 200, the planar mounting section 208p of the flexible circuit board 208 is mounted on an attachment surface 220p of the heat sink member 220 having an inner edge 220e (corresponding to junction between surfaces 220s and 220p) at the inner peripheral portion of the heat sink member 220. The attachment surface 220p of the heat sink member 220 is substantially planar (and is therefore referred to as a "planar" surface), for convenience in this example. The planar mounting section 208p of the flexible circuit board 208 may be attached to the planar attachment surface 220p of the heat sink member 220 by an adhesive or glue or by any other cost-effective means.

As described herein, substantially planar surfaces or regions, such as "planar" surfaces 220p and/or 220s and the "planar" region 208p of the flexible circuit board 208, need not be perfectly flat but may be somewhat contoured, curved and/or textured. Also, although surfaces and/or sections such as 220p and 220s and 208p and 208t are shown at right angles, these angles are not critical, and the elements may be constructed at somewhat different angles as may be convenient for use with a transmissive structure 201 of a particular shape and/or to facilitate easy or efficient assembly of the lighting device 200.

The flexible tabs 208t are bent at a substantial angle with respect to the planar mounting section 208p, around the inner edge 220e of the surface 220p of the heat sink 220, by pressure of the solid state emitters 206a, 206b mounted on the tabs 208t against the outer peripheral portion 201p along the contoured surface 201c of the light transmissive structure 201. In the embodiments of FIGS. 19 and 20, the tabs bend to form curved regions 208c around the edge 220e. A second surface 208b of each respective one of the tabs, opposite the first surface 208a of the respective tab, provides heat transfer to the heat sink member, to permit heat transfer from each solid state emitter on each respective tab to the heat sink member.

In the example of FIGS. 17 to 20, the device 200 also includes thermal interface material (TIM) 222 positioned between the second surface 208b of each tab 208t and a corresponding inner surface 220s of the heat sink member 220. The TIM 222 provides electrical insulation between the tabs 208t and the heat sink member 220, for example, for an implementation in which the heat slug of the emitter 206a, 206b is conductive. The TIM 222, however, also provides thermal conductivity to the heat sink member 220. In the examples, pressure created by contact of the solid state light emitters 206a, 206b with the outer peripheral portion 201p of the light transmissive structure 201 compresses the TIM 222 against the surface 220s of the heat sink member 220.

Any of a variety of different techniques may be used to facilitate heat transfer from the emitter(s) 206a, 206b on a respective tab around, over or through the tab to the heat sink member 220. In the example of the lighting device 200, there are one or more vias formed through each respective tab 208t, from the first surface 208a of the respective tab to the second surface 208b of the respective tab 208t (FIG. 19). Heat conductive material 224 may extend through each via from the first surface 208a of the respective tab 208t to the second surface 208b of the respective tab, to conduct heat from each solid state emitter 206a, 206b on the respective tab 208t. In a typical implementation, heat conductive pads 226 and 228 are also formed on the first and second surfaces 208a and 208b of each tab 208t. The heat conductive pad 226 on the first surface 208a contacts the heat slug of the emitter 206a, 206b on the respective tab 208t. The heat conductive pad 228 on the second surface 208b contacts the surface 220s of the heat sink member 220. The heat conductive material 224 extending through the vias through the tab 208t conducts heat from each solid state emitter on the respective tab 208t, from the first pad 226 on the respective tab to the second pad 228 on the respective tab for transfer to the heat sink member 220, in this case, through the compressed TIM 222.

When assembled to form the lighting device 200, the angle between the tab end 208t holding the light emitter 206a, 206b with respect to the planar mounting section 208p of the flexible circuit board in may roughly approach a right angle. However, this angle is somewhat arbitrary. Different angles will be used in actual fixtures, particularly for different shapes of the structure 201 and/or the heat sink member 220. The angle may be somewhat acute or somewhat obtuse but is sufficient for the tabs 208t to appropriately position and hold the solid state light emitters 206a, 206b against the outer peripheral portion 201p along the contoured surface 201c of the light transmissive structure 201. The positioning of each emitter 206a, 206b provides an orientation in which a central axis of emission of the respective light emitter is at a substantial angle with respect to the perpendicular axis of the aperture 214 and/or the aperture surface 212 of the light transmissive structure 201.

The angle of emission with respect to the aperture axis may be approximately perpendicular (90°) or obtuse or acute angles may be used. For example, with appropriate contours for the solid 201 and the heat sink member 220, it may be possible to aim the emitters 206a, 206b more toward the back of the reflector 216 (upward in the illustrated orientation), and the angle of direct emissions with respect to the illustrated axis might approach 45°. The intent, however, is for relatively little of the direct emissions to impact the optical aperture surface 212 at a steep angle. At least in the region 214 forming the actual aperture, those direct light emissions that impact the surface 212 impact at a relatively shallow angle. The ambient environment outside the device 200, e.g. air or water at the aperture surface 212, exhibits a low index of refraction. As a result, the light transmissive solid 201 has an index of refraction higher than the ambient environment. Hence, at least the portion 214 of the aperture surface 212 of the light transmissive solid 201 that serves as the optical aperture or passage out of the optical integrating volume 202 tends to exhibit total internal reflection with respect to light reaching that surface from within the transmissive solid 201 at relatively small angles of incidence with respect to that surface.

Light emitted at a low angle from any source 206a, 206b impacts the portion 214 of the aperture surface 212, and total internal reflection at that portion of the surface reflects the light back into the optical integrating volume 202. In contrast, light that has been diffusely reflected from regions of the surface 216s of the reflector arriving at larger angles to the surface 212 are not subject to total internal reflection and pass through portion 214 of the aperture surface 212 of the light transmissive solid 201.

The mask 218, therefore, can be relatively small in that it only needs to extend far enough out covering the aperture surface 212 of the light transmissive solid 201 so as to reflect those direct emissions of the solid state light emitters 206a, 206b that would otherwise impact the surface 212 at too high or large an angle for total internal reflection. In this way, the combination of total internal reflection in the portion 214 of the surface 212 of the solid 201 together with the reflective mask 218 reflects all or at least substantially all of the direct emissions from the emitters 206a, 206b, that otherwise would miss the reflector surface 216s, back into the optical integrating volume 202. Stated another way, a person in the area or region illuminated by the device 200 would not perceive the LEDs at 206a, 206b as visible individual light sources. Instead, all light from the LED type emitters 206a, 206b will diffusely reflect one or more times from the surface 216s before emergence through the portion 214 of the emission surface 212 of the solid 201. Since the surface 216s provides diffuse reflectivity, the volume 202 acts as an optical integrating cavity so that the portion 214 of the surface 212 forms an optical aperture providing a substantially uniform output distribution of integrated light (e.g. substantially Lambertian).

Hence, it is possible to utilize the total internal reflection to reduce the size of the mask 218 or otherwise enlarge the effective aperture (size of the optical passage) at 214 through which light emerges from the integrating volume 202. Due to the larger optical aperture or passage, the device 200 can actually emit more light with fewer average reflections within the integrating volume 202, improving efficiency of the fixture in comparison to prior fixtures that utilized cavities and apertures that were open to air. It may actually be possible to diffuse the light at the points where the LEDs 206a, 206b couple to the transmissive structure 201, e.g. by providing air gaps and/or surface texturing, to eliminate the mask 218 entirely. In this later arrangement, the total internal reflection at surface 212 serves as a virtual mask, to facilitate the desired reflections and optical integration within the volume 202.

In these embodiments, the reflective surface 216s and the combination of the reflective interior surface of the mask 218 and the total internal reflection along at least region 214 of the aperture surface 212 define the boundaries of the optical integrating volume 202. As noted, the solid transmissive structure 201 and the reflector 216 may be shaped so that the optical integrating cavity formed by the optical volume 202 may have any one of a variety of different shapes. For purposes of the discussion of the first example, however, the resulting optical integrating volume 202 is assumed to be hemispherical and the aperture 214 is circular.

The effective optical aperture at 214 forms a virtual source of the light from the lighting device 200. Essentially, electromagnetic energy, typically in the form of light energy from the one or more solid state emitters 206a, 206b, is diffusely reflected and integrated within the volume 202 as outlined above. This integration forms combined light for a virtual source at the output of the volume, that is to say at the effective optical aperture at 214. The integration, for example, may combine light from multiple sources or spread light from one small source across the broader area of the effective aperture at 214. The integration tends to form a relatively Lambertian distribution across the virtual source. When the fixture illumination is viewed from the area illuminated by the combined light, the virtual source at 214 appears to have substantially infinite depth of the integrated light. Also, the visible intensity is spread uniformly across the virtual source, as opposed to one or more individual small point sources of higher intensity as would be seen if the one or more solid state sources were directly observable without sufficient diffuse processing before emission through an aperture.

In systems and light fixtures as disclosed herein optical integrating volume 202 converts the point source output(s) of the plurality of solid state light emitting elements 206a, 206b to a virtual source output of light, at the effective optical aperture formed at region 214, which is free of pixilation or striations. The virtual source output is unpixelated and relatively uniform across the apparent output area of the fixture, e.g. across the portion 214 of the aperture surface 212 of the solid transmissive structure 201 in this first example (FIG. 20). The optical integration sufficiently mixes the light from the solid state light emitting elements 206a, 206b that the combined light output of the virtual source is at least substantially Lambertian in distribution across the optical output area of the cavity, that is to say across the effective optical aperture at 214. As a result, the light output exhibits a relatively low maximum-to-minimum intensity ratio across that region 214. In virtual source examples discussed herein, the virtual source light output exhibits a maximum-to-minimum ratio of 2 to 1 or less over substantially the entire optical output area. The area of the virtual source is at least one order of magnitude larger than the area of the point source outputs of the solid state light emitters 206a, 206b.

In this way, the diffuse optical processing may convert a single small area (point) source of light from solid state emitters 206a, 206b to a broader area virtual source at the region 214. The diffuse optical processing can also combine a number of such point source outputs to form one virtual source at the region 214.

The optical aperture 214 at the surface 212 of the solid type light transmissive structure 201 may serve as the light output if the device 200, directing optically integrated light of relatively uniform intensity distribution to a desired area or region to be illuminated in accord with a particular general lighting application of the fixture. In such an arrangement, the fixture may include a trim ring or the like (not shown) covering some or all of the exposed components shown in FIG. 20 (but not the aperture 214).

It is also contemplated that the device 200 may include one or more additional processing elements coupled to the effective optical aperture 214, such as a collimator, a grate, lens or diffuser (e.g. a holographic element). In some examples, the device 200 may include a further optical processing element in the form of a deflector or concentrator coupled to the optical aperture 214, to distribute and/or limit the light output to a desired field of illumination. For further discussion of various types of additional optical processing elements or 'secondary optics' that may be used at or coupled to the aperture, attention may be directed to US Patent Application Publications 2007/0138978, 2007/0051883 and 2007/0045524, for example.

As noted earlier, the drawings presented here as FIGS. 17 to 20 are somewhat stylized representations of embodiments of a lighting device 200 utilizing an optic 203 comprising a solid light transmissive structure 201, and a flexible circuit board 208 and a heat sink member 220, which are useful in illustrating and teaching the technologies under consideration here. However, it may be helpful to consider a few supplemental points regarding the fixture implementation illustrated by FIGS. 21 to 34.

Figures 21, 22:
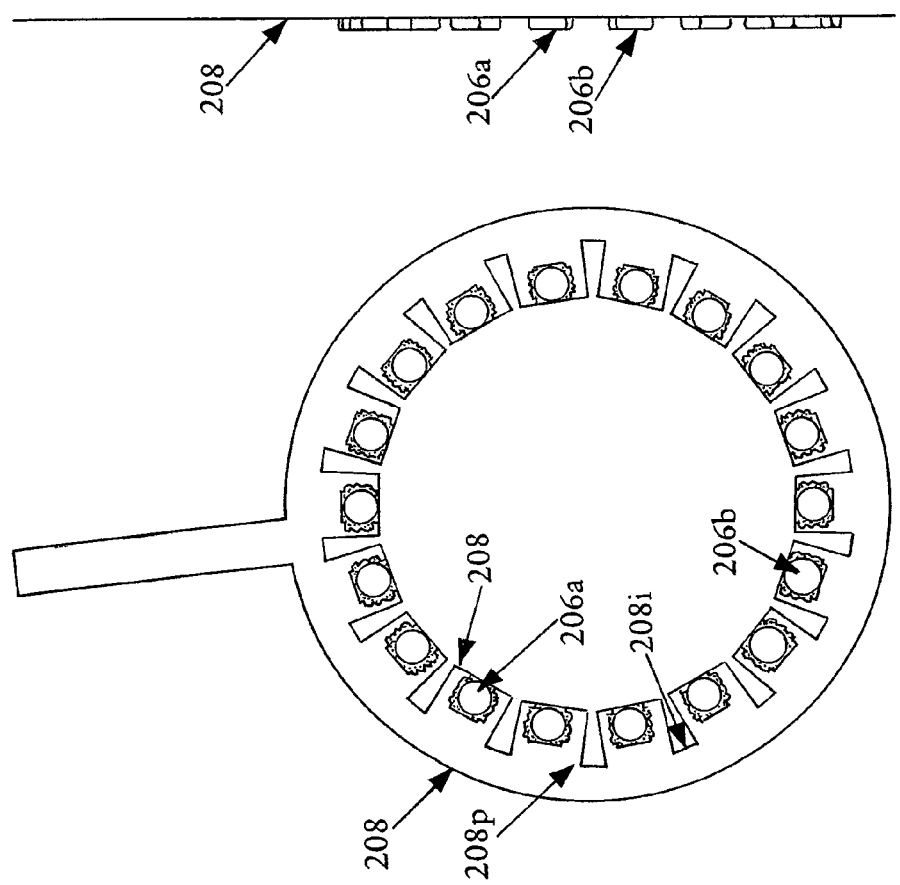
FIG. 21 is a plan view of the flexible circuit board used in the LED type lighting device of FIG. 17.
FIG. 22 is a side view of the flexible circuit board of FIG. 21.
Figure 24:
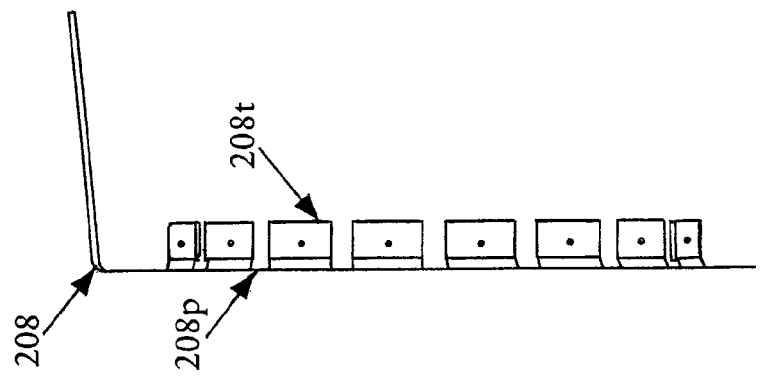
FIG. 24 is a side view of the flexible circuit board of FIG. 23.
Figure 23:
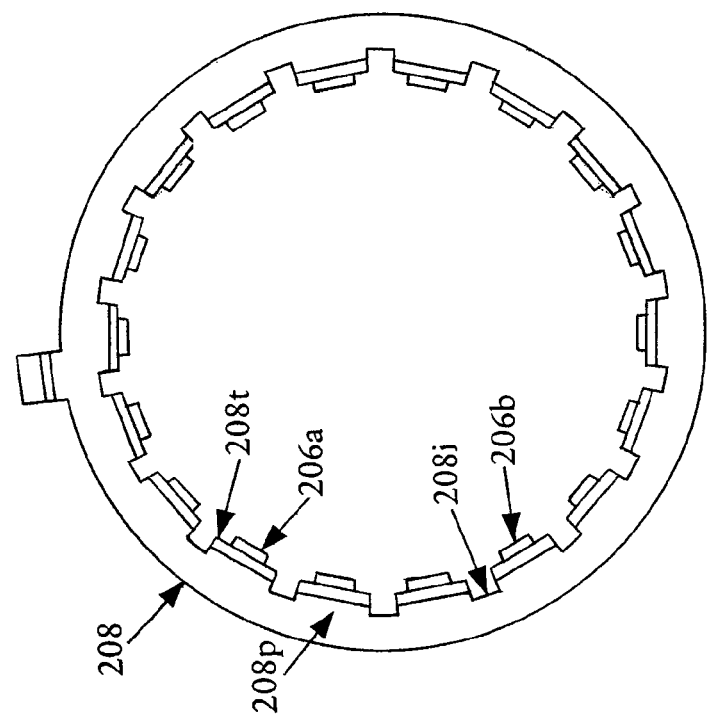
FIG. 23 is a plan view of the flexible circuit board, but showing how flexible elements of the board are bent or curved for installation in an LED type lighting device.
Figure 27:
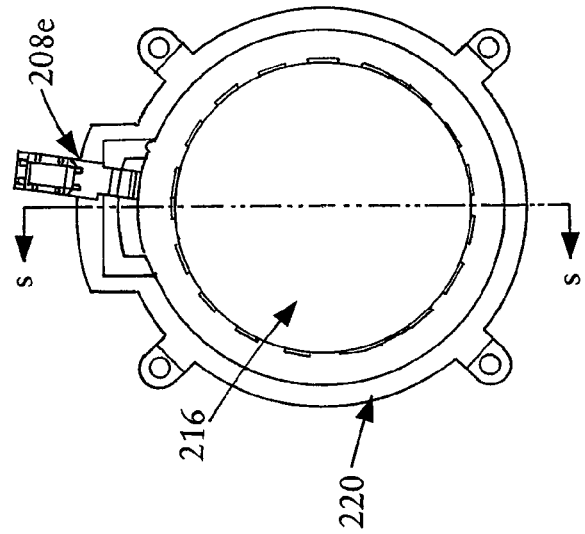
FIGS. 25 to 30 are various other views of the LED type lighting device of FIG. 17.
Figure 26:
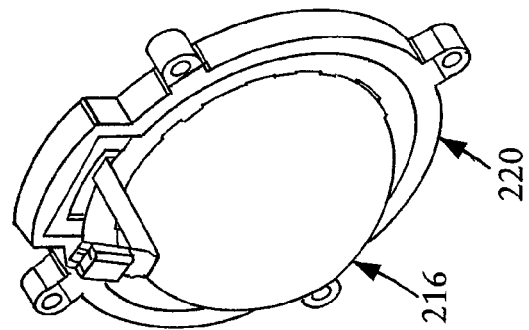
Figure 25:
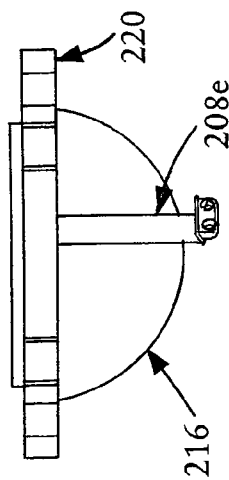
Figure 30:
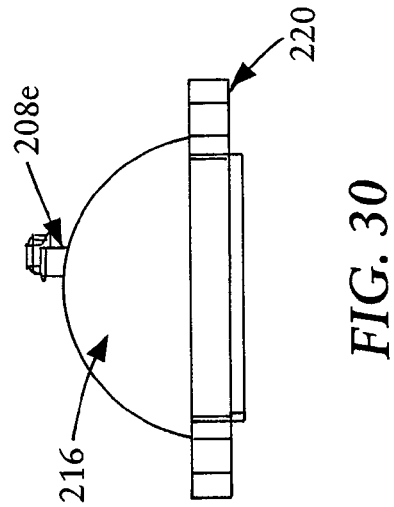
Figure 29:
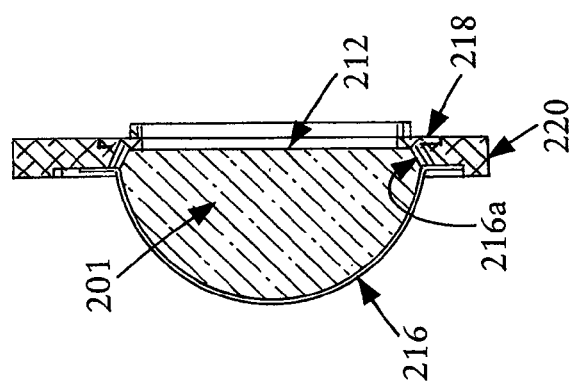
Figure 28:
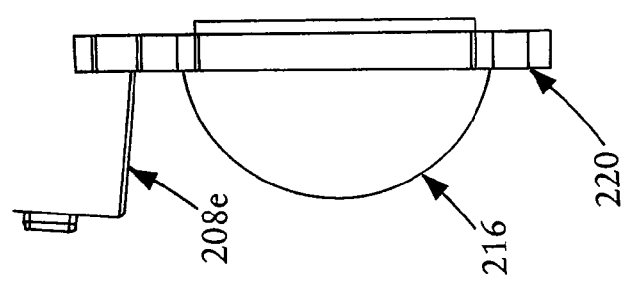

For example, FIG. 21 is a plan view and FIG. 22 is a side view of the flexible circuit board 208, with LEDs 206a, 206b attached to the tabs 208t. In this example, there are 18 tabs and 18 LEDs. Before assembly, as shown in these two drawings, the tabs 208t are in a flat state, substantially co-planar with each other and with the rest of the flexible circuit board 208. FIG. 23 is a plan view and FIG. 24 is a side view of the flexible circuit board 208, in a state in which the tabs 208t are bent as if the board were installed around the light transmissive structure (although the structure is omitted here for ease of illustration).

A fixture of the type outlined above will typically form part of a lighting system, which includes circuitry for driving the solid state light emitters to generate light (an example of which is discussed later with regard to FIG. 36). In the embodiments of the present disclosure, the flexible circuit board 208 includes a strip 208e extending away from the mounting section 208p of the flexible circuit board (see e.g. FIGS. 22 and 23). The strip 208e provides the electrical connections to other elements of the circuitry. In such an implementation, the heat sink member 220 may include a passage, for example in an extension of the member 220, as shown in drawing figures such as FIGS. 25 to 30. The strip 208e of the flexible circuit board can be bent with respect to the mounting section of the flexible circuit board (see e.g. FIGS. 23 and 24), to enable the strip to pass through the passage of the heat sink member (see e.g. FIGS. 26 to 31) to connect to the circuitry.

The heat sink member 220 has an inner peripheral portion of substantially similar shape and of a size slightly larger than the outer peripheral portion of the light transmissive structure 201. In this case, the heat sink member 220 has a circular inner peripheral portion but with a surface 242 (FIGS. 31 and 33) at a slant corresponding to the angle of surface 201p. The obtuse angle of the peripheral optical coupling surface 201p with respect to the optical aperture surface 212 of light transmissive structure is approximately 120° (interior angle with respect to the horizontal in the illustrated orientation is 60°, and angle of the surface cross section relative to the vertical in the illustrated orientation is 30°). Hence, although the inner peripheral portion of the heat sink member 220 has a somewhat larger diameter than the outer peripheral portion of the light transmissive structure 201, the inner surface (242 in FIG. 31) of the heat sink member 220 is machined to have an angle of approximately 120° with respect to the optical aperture surface 212 (interior angle with respect to the horizontal in the illustrated orientation of FIG. 17 is 60°, and angle of the surface cross section relative to the vertical in the illustrated orientation of FIG. 17 is 30°).

The ring shaped heat sink member 220 in the example is a single solid member, for example, formed of aluminum. Those skilled in the art will realize that other configurations may be used, as discussed above with regard to other examples. The opposite side of heat sink member 220 (FIG. 34) may have a ring-shaped indentation 246 for mating with the mask 218 (FIG. 17). The exemplary heat sink also includes one or more posts 244 (FIGS. 31-34) extending outward from the main part of the ring. Each post 246 has a screw or bolt hole for passage of a bolt or similar fastener, for use in the assembly of the light engine 200 together with other components.

The light engine of the embodiment of FIG. 17 is intended for use with other elements to form a commercial fixture. As shown in cross-section in FIG. 35, the commercial fixture product 230 includes the elements of the light engine, including the reflector 216, emitters 206a, 206b, light transmissive structure 201 (with aperture surface 212), mask 218, heat sink ring 220, etc. The fixture 230 also includes an upper housing or cover 232 and a lower housing 236. The upper housing 232 encloses the reflector 216 and the solid light transmissive structure 201 although it is somewhat larger than the reflector 216 and the solid light transmissive structure 201 so that there is some space between the reflector and the inner curved surface of the upper housing 232.

The fixture 230 also includes a flexible compressible pad 234, between the inner surface of the upper housing 232 and the outer surface of the reflector 216. Although other attachment mechanisms may be used, in this example, the upper housing 232 is bolted to a lower housing 236. The bolts extend through holes in posts 244 formed in the heat sink ring 220 (see e.g. FIGS. 31-34). In this way, the heat sink ring 220 is sandwiched between opposed surfaces of the housing members 232, 236 (FIG. 35). The inner surface of the upper housing 232 and the pad 234 are sized so that the assembly of the housings and the heat sink ring compresses the pad 234 between the inner surface of the upper housing 232 and the outer surface of the reflector 216. This applies pressure through the reflector 216 to the solid light transmissive structure 201, to hold the structure 76 as well as the LEDs 206a, 206b, the tabs of the flexible circuit board and the TIM against the angled surface of the heat sink ring 208, as shown for example in FIGS. 17 and 36. The aperture surface 212 also abuts the white reflective surface of the mask 218. The use of the angled shapes also tends to align the various components of the lighting device (200 in FIG. 17) in the desired manner, for example, without tilt of the structure 201 or surface 212 relative to the mask 218.

The housing elements 232, 236, like the heat sink ring 208, are formed of a good heat conductive material. In the example, the housings 232, 236 may be cast aluminum elements. Outer portions of one or preferably both housings 232, 236 incorporate fins. Heat from the emitters 206a, 206b is transferred to the heat sink ring 208, as discussed earlier. From the ring 208, the heat travels to the housings 232, 236 where it may be dissipated to the surrounding atmosphere via the fins. To promote heat transfer from the heat sink member or ring 208 to the housings, the fixture may include adhesive TIM layers on the appropriate surfaces of the heat sink ring 208 (see FIG. 17).

The fixture 230 illustrated in FIG. 35 also includes a secondary optic. Although other secondary optics may be used, in this example the secondary optic includes a deflector or concentrator 238 having a reflective inner surface. The surface may have different reflective characteristics. For example specular, semi-specular and diffuse reflectivities and/or combinations thereof are contemplated. As noted above, the surface of the mask 218 that faces into the optical integrating volume 202 (faces upward in the orientation illustrated in FIGS. 17 and 35) may be diffusely reflective. The mask includes a boss formed to extend away from the aperture surface 212. The inner surface of this boss or extension faces across the aperture opening through the mask 218 and might be considered the start of the secondary optic formed by or together with the deflector 238. The inner surface of the boss or extension and the inner surface of the deflector 238 may have similar specular reflective properties. As shown in FIG. 36, the fixture 230 may also include a trim ring 240 to facilitate a desired appearance when the fixture for example is mounted in a ceiling.

Figure 36:
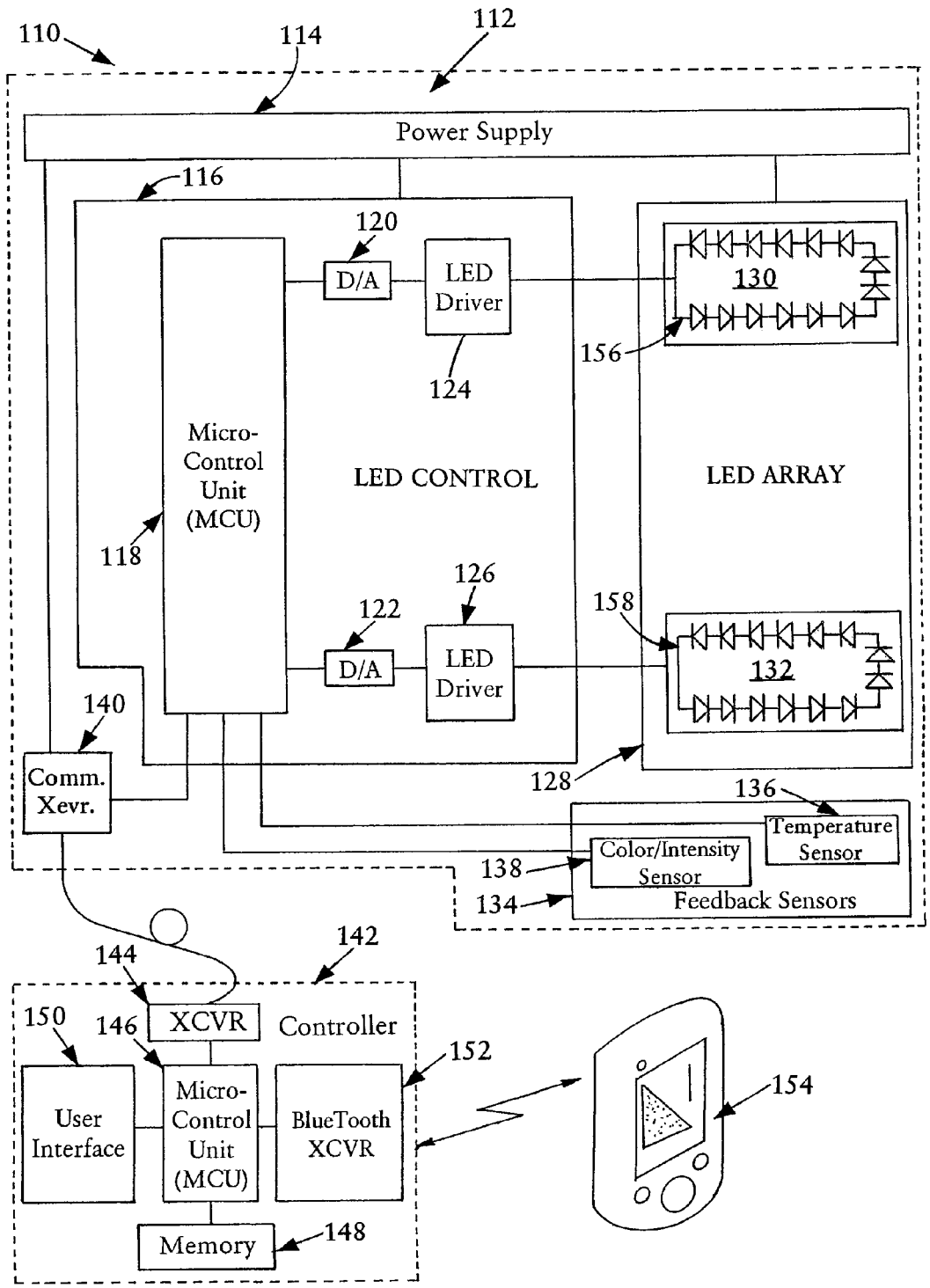
FIG. 36 illustrates a lighting apparatus combined with circuitry for controlling operation of one or more of the plurality of solid state light emitters according to an embodiment of the present invention.

FIG. 36 is a block diagram of an exemplary solid state lighting system 110, including control circuitry and solid state LED light sources used as a light engine 112 in the lighting apparatus of such a system. Those skilled in the art will recognize that the system 110 may include a number of the solid state light engines 112. The light engine(s) could be incorporated into a fixture comprising any of the arrays discussed above.

The circuitry of FIG. 36 provides digital programmable control of the light. Those skilled in the art will recognize that simpler electronics may be used for some fixture configurations.

In the light engine 112 of FIG. 36, the set of solid state sources of light takes the form of a LED array 128. Although combinations of solid state light emitters are within the scope of the present teachings, for purposes of discussion of the exemplary circuitry, we will assume that the array includes at least two types of solid state light emitters. Hence, the exemplary array 128 comprises two types of solid state light emitters. A first type 130 that contains an index matching material and does not contain the material for changing the wavelength of the emitted light, and a second type 132 that contains the material for changing the wavelength of the emitted light. For example, the array 128 may comprise fifteen first type solid state light emitters 156 and fifteen second type solid state light emitters 158.

The electrical components shown in FIG. 36 also include a LED control system 116 as part of the light engine 112. The system 116 includes LED driver circuits 124 and 126 for the respective solid state light emitters 156 and 158, associated digital to analog (D/A) converters 120 and 122 and a programmable micro-control unit (MCU) 118. The driver circuits 124 and 126 supply electrical current to the LEDs of the respective solid state light emitters 156 and 158 to cause the LEDs to emit light. Each of the driver circuits may be implemented by a switched power regulator (e.g. Buck converter), where the regulated output is controlled by the appropriate signal from a respective D/A converter. The driver circuits supply electrical current at the level for the individual sets of solid state light emitters to cause the LEDs to emit light. The MCU 118 controls the LED driver circuit 124 via the D/A converter 120, and the MCU 118 controls the LED driver circuit 126 via the D/A converter 122. The amount of the emitted light of a given solid state light emitter set is related to the level of current supplied by the respective driver circuit, as set by the MCU 118 through the respective D/A converter.

In operation, one of the D/A converters receives a command for a particular level, from the MCU 118. In response, the converter generates a corresponding analog control signal, which causes the associated LED driver circuit to generate a corresponding power level to drive the particular string of LEDs. The LEDs of the string in turn output light of a corresponding intensity. The D/A converter will continue to output the particular analog level, to set the LED intensity in accord with the last command from the MCU 118, until the MCU 118 issues a new command to the particular D/A converter.

The control circuit could modulate outputs of the LEDs by modulating the respective drive signals. In the example, the intensity of the emitted light of a given LED is proportional to the level of current supplied by the respective driver circuit. The current output of each driver circuit is controlled by the higher level logic of the system. In this digital control example, that logic is implemented by the programmable MCU 118, although those skilled in the art will recognize that the logic could take other forms, such as discrete logic components, an application specific integrated circuit (ASIC), etc.

The LED driver circuits and the MCU 118 receive power from a power supply 114, which is connected to an appropriate power source (not separately shown). For most general lighting applications, the power source will be an AC line current source, however, some applications may use DC power from a battery or the like. The power supply 114 converts the voltage and current from the source to the levels needed by the driver circuits 124 and 126 and the MCU 118.

A programmable microcontroller, such as the MCU 118, typically comprises a programmable processor and includes or has coupled thereto random-access memory (RAM) for storing data and read-only memory (ROM) and/or electrically erasable read only memory (EEROM) for storing control programming and any pre-defined operational parameters, such as pre-established light 'recipes' or dynamic color variation 'routines.' The MCU 118 itself comprises registers and other components for implementing a central processing unit (CPU) and possibly an associated arithmetic logic unit. The CPU implements the program to process data in the desired manner and thereby generates desired control outputs to cause the system to generate a virtual source of a desired output characteristic.

The MCU 118 is programmed to control the LED driver circuits 124 and 126 to set the individual output intensities of the LEDs to desired levels in response to predefined commands, so that the combined light emitted from the optical aperture or passage of the integrating volume has a desired spectral characteristic and a desired spectral characteristic and overall intensity. Although other algorithms may be implemented by programming the MCU 118, in a variable color lighting example, the MCU 118 receives commands representing the appropriate intensity settings of the first and second type solid state light emitters and converts those to appropriate driver settings for the LEDs of respective groups 156 and 158 in the array 128.

The electrical components may also include one or more feedback sensors 134, to provide system performance measurements as feedback signals to the control logic, implemented in this example by the MCU 118. A variety of different sensors may be used, alone or in combination, for different applications. In the illustrated examples, the set 134 of feedback sensors includes a color and intensity sensor (C/I) 138 and a temperature sensor 136. Although not shown, other sensors, such as a separate overall intensity sensor may be used. The sensors are positioned in or around the fixture to measure the appropriate physical condition, e.g. temperature, color, intensity, etc.

The sensor 138, for example, is coupled to detect color distribution in the integrated light energy. The sensor 138 may be coupled to sense energy within the optical integrating volume, within the deflector (if provided) or at a point in the field illuminated by the particular system. Various examples of appropriate color sensors are known. For example, the sensor 138 may be a digital compatible sensor, of the type sold by TAOS, Inc.

The temperature sensor 136 may be a simple thermo-electric transducer with an associated analog to digital converter, or a variety of other temperature detectors may be used. The temperature sensor is positioned on or inside of the fixture, typically at a point that is near the LEDs or other sources that produce most of the system heat. The temperature sensor 136 provides a signal representing the measured temperature to the MCU 118. The system logic, here implemented by the MCU 118, can adjust intensity of one or more of the LEDs in response to the sensed temperature, e.g. to reduce intensity of the source outputs to compensate for temperature increases. The program of the MCU 118, however, would typically manipulate the intensities of the various LEDs so as to maintain the desired color balance between the various wavelengths of light used in the system, even though it may vary the overall intensity with temperature.

In a typical general lighting application in say an architectural setting, the fixture and associated solid state light engine 112 will be mounted or otherwise installed at a location of desired illumination. The light engine 112, however, will be activated and controlled by a controller 142, which may be at a separate location. For example, if the fixture containing the light engine 112 is installed in the ceiling of a room as a downlight for task or area illumination, the controller 142 might be mounted in a wall box near a door into the room, much like the mounting of a conventional ON-OFF wall switch for an incandescent or fluorescent light fixture. Those skilled in the art will recognize that the controller 142 may be mounted in close proximity to or integrated into the light engine 112. In some cases, the controller 142 may be at a substantial distance from the light engine. It is also conceivable that the separate controller 142 may be eliminated and the functionality implemented by a user interface on the light engine in combination with further programming of the MCU 118.

The circuitry of the light engine 112 includes a wired communication interface or transceiver 140 that enables communications to and/or from a transceiver 144, which provides communications with the micro-control unit (MCU) 146 in the controller 142. Typically, the controller will include one or more input and/or output elements for implementing a user interface 150. The user interface 150 may be as simple as a rotary switch or a set of pushbuttons. As another example, the controller 142 may also include a wireless transceiver, in this case, in the form of a Bluetooth transceiver 152. A number of light engines 112 of the type shown may connect over common wiring, so that one controller 142 through its transceiver 144 can provide instructions via interfaces 140 to the MCUs 118 in several such light engines, thereby providing common control of a number of light fixtures.

A programmable microcontroller, such as the MCU 146, typically comprises a programmable processor and includes or has coupled thereto random-access memory (RAM) for storing data and read-only memory (ROM) and/or electrically erasable read only memory (EEROM) for storing control programming and any pre-defined operational parameters, such as pre-established light 'recipes' or dynamic color variation 'routines.' In the example, the controller 142 is shown as having a memory 148, which will store programming and control data. The MCU 146 itself comprises registers and other components for implementing a central processing unit (CPU) and possibly an associated arithmetic logic unit. The CPU implements the program to process data in the desired manner and thereby generates desired control outputs to cause the controller 142 to generate commands to one or more light engines to provide general lighting operations of the one or more controlled light fixtures.

The MCU 142 may be programmed to essentially establish and maintain or preset a desired 'recipe' or mixture of the available wavelengths provided by the LEDs used in the particular system, to provide a desired intensity and/or spectral setting. For each such recipe, the MCU 142 will cause the transceiver 140 to send the appropriate command to the MCU 118 in the one or more light engines 112 under its control. Each fixture that receives such an instruction will implement the indicated setting and maintain the setting until instructed to change to a new setting. For some applications, the MCU 146 may work through a number of settings over a period of time in a manner defined by a dynamic routine. Data for such recipes or routines may be stored in the memory 148.

As noted, the controller 142 includes a Bluetooth type wireless transceiver 152 coupled to the MCU 146. The transceiver 152 supports two-way data communication in accord with the standard Bluetooth protocol. For purposes of the present discussion, this wireless communication link facilitates data communication with a personal digital assistant (PDA) 154. The PDA 154 is programmed to provide user input, programming and attendant program control of the system 110.

For example, preset color and intensity settings may be chosen from the PDA 154 and downloaded into the memory 148 in the controller 142. If a single preset is stored, the controller 142 will cause the light engine 112 to provide the corresponding light output, until the preset is rewritten in the memory. If a number of presets are stored in the memory 148 in the controller 142, the user interface 150 enables subsequent selection of one of the preset recipes for current illumination. The PDA also provides a mechanism to allow downloading of setting data for one or more lighting sequences to the controller memory.

The present disclosure provides an aesthetically pleasing, energy efficient, economical lighting apparatus for general lighting by allowing the tuning of the color and brightness of the emitted light using only one type of solid state light source.

While the foregoing has described what are considered to be the best mode and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

What is claimed is:

1. A solid state lighting device, comprising:
a plurality of solid state light emitters, each having a cover for protecting a light source positioned inside each solid state emitter, and each solid state light emitter configured for emitting light in a predetermined spectrum;
an optic, positioned outside of each cover of the solid state emitters, for combining light received from the plurality of solid state light emitters to form output light of the device,
wherein at least a portion of the optic for receiving light from the plurality of solid state light emitters is formed of a light transmissive solid having an index of refraction, and having a surface facing each cover of the plurality of solid state emitters; and
an index matching material positioned on a first region of the surface of the light transmissive solid, the index matching material for matching the index of refraction of the light transmissive solid, in an optical path between a light emission output of at least one first solid state light emitter and the first region of the surface of the light transmissive solid arranged to receive light from the at least one first solid state light emitter,
wherein at least one second solid state light emitter is coupled to supply light to the light transmissive solid without any index matching material in an optical path between a light emission output of the at least one second solid state light emitter and a second region of the surface of the light transmissive solid arranged to receive light from the at least one second solid state light emitter.

2. The solid state lighting device according to claim 1, further comprising a reflector having a diffusely reflective interior surface extending over at least a substantial portion of the outer surface of the light transmissive solid to form an optical cavity including the volume of the light transmissive solid, a portion of an aperture surface of the light transmissive solid forming an optical aperture of the cavity.

3. The solid state lighting device according to claim 1, further comprising a heat sink member having an inner peripheral portion of a size larger than an outer peripheral portion of the light transmissive solid and having an inner surface at an angle at least substantially corresponding to the angle formed by a peripheral optical coupling surface of the light transmissive solid.

4. The solid state lighting device according to claim 1, wherein at least one solid state light emitter further comprises a material for changing the wavelength of the light emitted from the light source in the optical path between the light emission output of at least one first solid state light emitter and a surface of the light transmissive solid.

5. The solid state lighting device according to claim 4, wherein the material for changing the wavelength of light comprises at least one phosphor.

6. The solid state lighting device according to claim 5, wherein the at least one phosphor is a yttrium aluminum garnet (YAG) phosphor.

7. The solid state lighting device according to claim 4, wherein the material for changing the wavelength of the emitted light substantially fills a region of the at least one solid state light emitter between the light source and the light transmissive solid.

8. The solid state lighting device according to claim 1, wherein the index matching material is deposited on the light transmissive solid.

9. The solid state lighting device according to claim 1, wherein the lighting device emits a substantially white light.

10. The solid state lighting device according to claim 1, wherein the fixture comprises a substantially equal number of first solid state light emitters and second solid state light emitters.

11. The solid state lighting device according to claim 1, wherein the index matching material comprises a silicone.

12. The solid state lighting device according to claim 1, in combination with circuitry for controlling operation of one or more of the plurality of solid state light emitters.

13. A solid state lighting device, comprising:
a plurality of solid state light emitters, each configured for emitting light in a predetermined spectrum;
an optic for combining light received from the plurality of solid state light emitters to form output light of the device, wherein at least a portion of the optic for receiving light from the plurality of solid state light emitters is formed of a light transmissive solid having an index of refraction; and
a heat sink member having an inner peripheral portion of a size larger than an outer peripheral portion of the light transmissive solid and having an inner surface at an angle at least substantially corresponding to the angle formed by a peripheral optical coupling surface of the light transmissive solid; and
a flexible circuit board, the flexible circuit board comprising:
 (a) a mounting section mounted on the heat sink member, and
 (b) a plurality of flexible tabs attached to and extending from the mounting section of the flexible circuit board, each flexible tab being bent around the heat sink member and positioned between the angled inner surface of the inner peripheral portion of the heat sink member and the angled peripheral optical coupling surface of the light transmissive solid,
an index matching material for matching the index of refraction of the light transmissive solid, in an optical path between a light emission output of at least one first solid state light emitter and each surface of the light transmissive solid arranged to receive light from the at least one first solid state light emitter, wherein:
at least one second solid state light emitter is coupled to supply light to the light transmissive solid without any index matching material in an optical path between a light emission output of the at least one second solid state light emitter and each surface of the light transmissive solid arranged to receive light from the at least one second solid state light emitter, and
each of the plurality of solid state light emitters is mounted on a tab of the flexible circuit board and positioned by the respective tab between the respective tab and the angled peripheral optical coupling surface of the outer peripheral portion of the light transmissive solid.

* * * * *